US012581635B2

(12) United States Patent
Lin et al.

(10) Patent No.: US 12,581,635 B2
(45) Date of Patent: Mar. 17, 2026

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Kao-Cheng Lin, Hsinchu (TW); Hidehiro Fujiwara, Hsinchu (TW); Yen Lin Chung, Hsinchu (TW); Wei Min Chan, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 482 days.

(21) Appl. No.: 18/325,855

(22) Filed: May 30, 2023

(65) Prior Publication Data

US 2024/0251540 A1 Jul. 25, 2024

Related U.S. Application Data

(60) Provisional application No. 63/481,292, filed on Jan. 24, 2023.

(51) Int. Cl.
*H10B 10/00* (2023.01)
*G11C 11/412* (2006.01)
*G11C 11/418* (2006.01)

(52) U.S. Cl.
CPC .......... *H10B 10/125* (2023.02); *G11C 11/412* (2013.01); *H10B 10/12* (2023.02); *H10B 10/18* (2023.02); *G11C 11/418* (2013.01)

(58) Field of Classification Search
CPC ...... H10B 10/125; H10B 10/18; H10B 10/12; G11C 11/418; G11C 11/412
See application file for complete search history.

(56) References Cited

U.S. PATENT DOCUMENTS

| | | | |
|---|---|---|---|
| 2024/0153551 A1* | 5/2024 | Chen ..................... | G11C 11/418 |
| 2024/0251541 A1* | 7/2024 | Chung .................. | H10B 10/12 |
| 2024/0312492 A1* | 9/2024 | Chung .................. | G11C 11/412 |
| 2024/0321344 A1* | 9/2024 | Choi ..................... | G11C 11/412 |

FOREIGN PATENT DOCUMENTS

| | | |
|---|---|---|
| TW | 525292 | 3/2003 |
| TW | 202020947 | 6/2020 |
| TW | 202247429 | 12/2022 |

* cited by examiner

*Primary Examiner* — David Vu
*Assistant Examiner* — Brandon C Fox
(74) *Attorney, Agent, or Firm* — Hauptman Ham, LLP

(57) ABSTRACT

An integrated circuit (IC) device includes a memory array including a plurality of memory cells, a first word line over the memory array and electrically coupled to at least one first memory cell among the plurality of memory cells, and a second word line under the memory array and electrically coupled to at least one second memory cell among the plurality of memory cells. Each memory cell among the plurality of memory cells includes complementary field-effect transistor (CFET) devices.

20 Claims, 18 Drawing Sheets

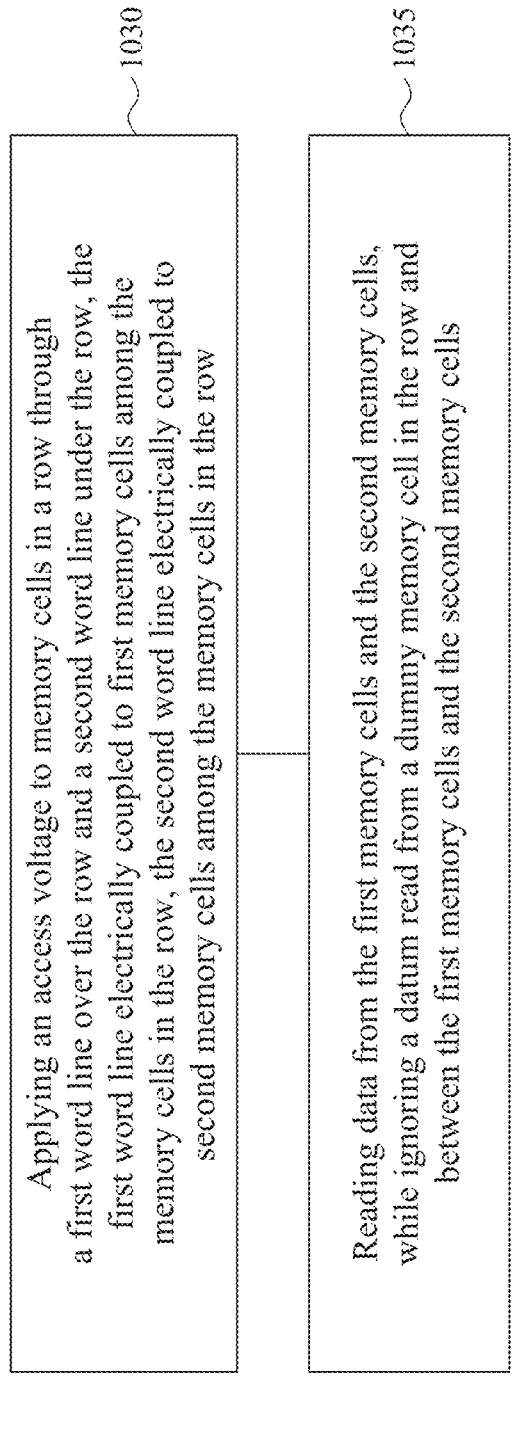

Applying an access voltage to memory cells in a row through a first word line over the row and a second word line under the row, the first word line electrically coupled to first memory cells among the memory cells in the row, the second word line electrically coupled to second memory cells among the memory cells in the row

1030

Reading data from the first memory cells and the second memory cells, while ignoring a datum read from a dummy memory cell in the row and between the first memory cells and the second memory cells

1104
Memory

1106
Instructions

1107
Standard Cell library
including:
Standard Cells

1142
User Interface (UI)

1110
I/O

1102
Processor

1112
Network
Interface

1114
Network

INTEGRATED CIRCUIT DEVICE AND METHOD

RELATED APPLICATION(S)

This application claims the benefit of U.S. Provisional Application No. 63/481,292, filed Jan. 24, 2023, which is herein incorporated by reference in its entirety.

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the sizes of IC devices, sometimes a layer of semiconductor devices is formed, or bonded, over another layer of semiconductor devices. Examples include complementary field effect transistor (CFET) devices in which an upper or top semiconductor device overlies a lower or bottom semiconductor device in a stack configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10B are flowcharts of various methods, in accordance with some embodiments.

DETAILED DESCRIPTION

Figure 1A:
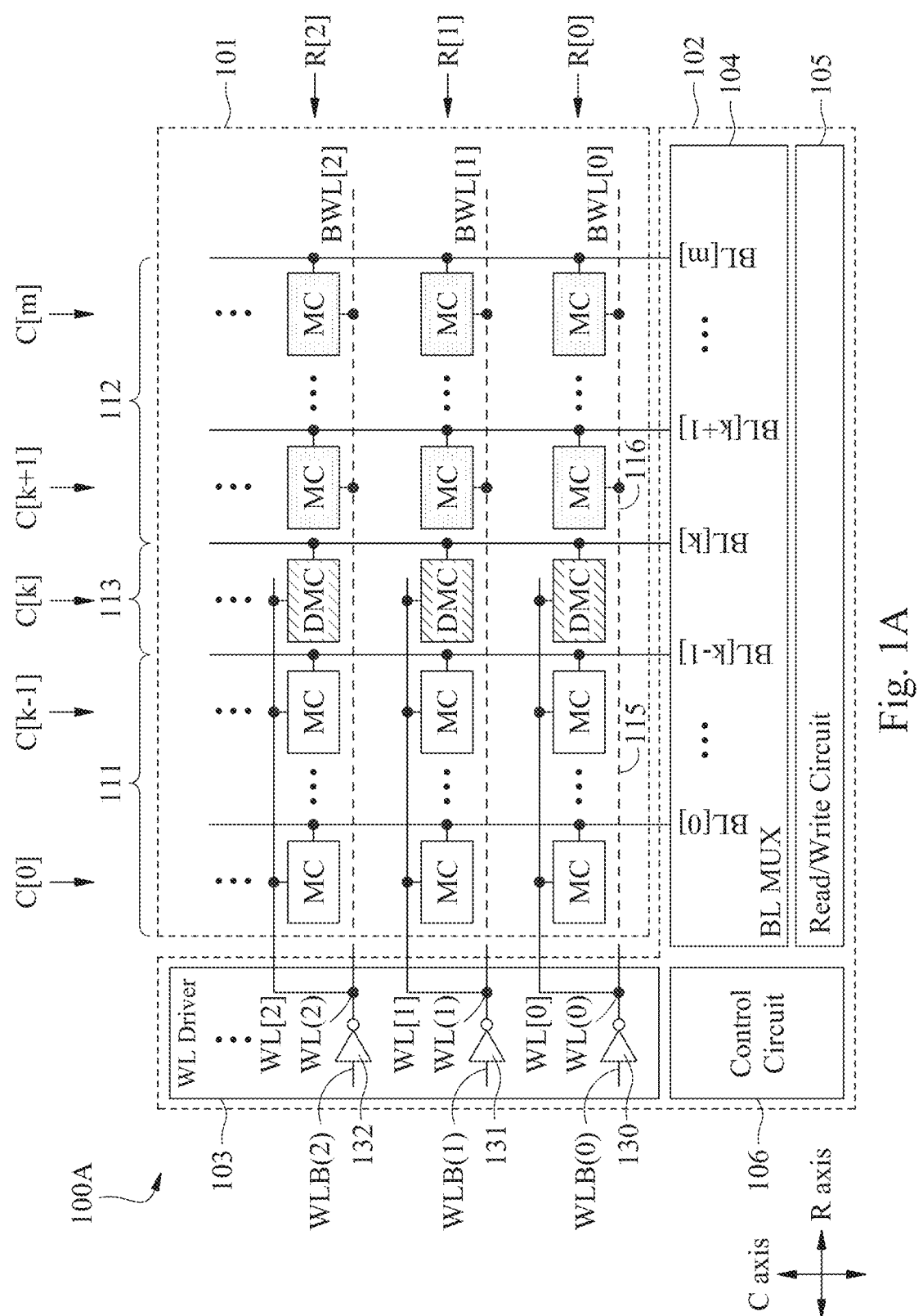
FIGS. 1A-1C are schematic block diagrams of various memory devices, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an IC device comprises a memory device having a memory array of memory cells, a first word line over the memory array and electrically coupled to at least one memory cell in the memory array, and a second word line under the memory array and electrically coupled to at least one further memory cell in the memory array. The first word line and second word line are sometimes referred correspondingly to as the front side word line and back side word line. In at least one embodiment, by using both front side word lines and back side word lines for accessing memory cells in a memory device, it is possible to reduce word line loading and, as a result, reduce a timing delay and increase an access speed of the memory device.

In some embodiments, a fly word line configuration is provided. In a fly word line configuration in accordance with at least one embodiment, a front side word line and a back side word line are electrically coupled together. One of the front side word line and back side word line is a fly word line which flies over, without being electrically coupled to, memory cells in a first, or proximal, segment of a memory row in the memory array. The fly word line is electrically coupled to memory cells in a second, or distal, segment of the memory row. The other of the front side word line and back side word line is physically shorter than the fly word line, and is electrically coupled to the memory cells in the proximal segment of the memory row. As a result, in one or more embodiments, it is possible to reduce both resistance and capacitance on the shortened word line which does not have a section over or under the distal segment of the memory row. One the other hand, it is possible to reduce at least capacitance of a section of the fly word line that flies over the proximal segment of the memory row, in one or more embodiments.

In some embodiments, a hybrid word line configuration is provided. In a hybrid word line configuration in accordance with at least one embodiment, a front side word line and a back side word line are independently controlled one from another. Two memory rows are between the front side word line and back side word line. A memory cell in one of the two memory rows is electrically coupled to one of the front side word line and back side word line, and a corresponding memory cell in the other memory row is electrically coupled to the other of the front side word line and back side word line. Any arrangement (or dichotomy), along one of the two memory rows, of memory cells electrically coupled to the front side word line and memory cells electrically coupled to the back side word line is possible in one or more embodiments. As a result, in at least one embodiment, it is possible to increase a width of the front side word line and back side word line across the two memory rows, and reduce resistance of the front side word line and back side word line.

FIG. 1A is a schematic block diagram of a memory device 100A, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100A comprises a memory array 101 of a plurality of memory cells MC, and a memory controller 102 coupled to control an operation of the memory cells MC. In the memory array 101, the memory cells MC are arranged in a plurality of columns C[0]-C[m], where m is a natural number, and rows R[0], R[1], R[2], or the like. Columns and rows in a memory array are sometimes referred to as memory columns and memory rows. The memory columns extend in a column direction, designated as C axis in the drawings. The memory rows extend in a row direction transverse to the column direction, and designated as R axis in the drawings. In at least one embodiment, the memory cells MC are static random-access memory (SRAM) memory cells. Other memory configurations and/or types are within the scopes of various embodiments.

The memory device 100A further comprises a plurality of word lines along the rows of the memory array 101, and a plurality of bit lines extending along the columns of the memory array 101. The word lines are commonly referred to herein as WL, and the bit lines are commonly referred to herein as BL. Unless otherwise specified, both front side word lines and back side word lines are commonly described or referred to as word lines WL. In some embodiments, each bit line comprises a pair of bit lines BL and BLB which, unless otherwise specified, are described or referred to as bit lines BL. Each of the memory cells MC is coupled to the memory controller 102 by a corresponding word line and a corresponding bit line. The word lines WL are configured for transmitting addresses of memory cells MC to be read from, and/or to be written to, or the like. The word lines WL are sometimes referred to as "address lines." The bit lines BL are configured for transmitting data to be written to, and/or read from, the memory cells MC indicated by the addresses on the corresponding word lines WL, or the like. The bit lines BL are sometimes referred to as "data lines." Various numbers of word lines WL and/or bit lines BL in the memory device 100A are within the scope of various embodiments.

The memory controller 102 comprises a word line driving circuit 103, bit line multiplexers (BL MUX) 104, read/write circuits 105 which are configured to perform at least one of a read operation or a write operation for one or more selected memory cells MC in the memory array 101. The word line driving circuit 103 is configured to decode a row address of one or more memory cells MC selected to be accessed in a read operation or a write operation. The word line driving circuit 103 further comprises a plurality of word line drivers 130, 131, 132, or the like, each coupled to one or more corresponding word lines WL as described herein. The word line driving circuit 103 is configured to supply, through the corresponding word line drivers 130, 131, 132, or the like, a set of access voltages to the selected word line(s) WL corresponding to the decoded row address, and a different set of voltages (e.g., zero) to the other, unselected word lines WL. Each of the bit line multiplexers 104 is coupled to one or more bit lines BL. The read/write circuits 105 are coupled to the bit line multiplexers 104, and are configured to decode a column address of the memory cells MC to be accessed in a read operation or a write operation. The read/write circuits 105 are configured to supply, through the bit line multiplexers 104, a set of voltages to the selected bit line(s) BL corresponding to the selected memory cells MC to be accessed, and a different set of voltages to the other, unselected bit lines BL. In a read operation, one or more sense amplifiers (not shown) of the read/write circuits 105 are configured to sense data read from the accessed memory cells MC and retrieved through the corresponding bit line(s) BL. The memory controller 102 further comprises a control circuit 106 configured to control operations of the word line driving circuit 103, bit line multiplexers 104, read/write circuits 105 and/or other components in the memory controller 102. In at least one embodiment, the memory controller 102 further includes one or more clock generators for providing clock signals for various components of the memory device 100A, one or more input/output (I/O) circuits for data exchange with external devices, and/or one or more sub-controllers for controlling various operations in the memory device 100A. The described memory device configuration is an example, and other memory device configurations are within the scopes of various embodiments.

In the example configuration in FIG. 1A, memory cells MC in each memory column are electrically coupled to a common bit line. For example, memory cells MC in memory columns C[0], C[k−1], C[k], C[k+1], C[m], where k is a natural number smaller than m, are electrically coupled correspondingly to bit lines BL[0], BL[k−1], BL[k], BL[k+1], BL[m].

Memory cells MC in each memory row are electrically coupled to a front side word line or a back side word line. As described herein, a front side word line is a word line over the memory array or at a front side of a substrate over which the memory array is formed, and a back side word line is a word line under the memory array or at a back side of the substrate. In the drawings, front side word lines are illustrated by solid lines and designated with labels including "WL," whereas back side word lines are illustrated by dot-dot lines and designated with labels including "BWL." For example, memory cells MC in memory row R[0] are electrically coupled to front side word line WL[0] or back side word line BWL[0]. Specifically, memory row R[0] comprises a first segment including memory cells MC electrically coupled to bit lines BL[0]-BL[k−1] and front side word line WL[0], and a second segment including memory cells MC electrically coupled to bit lines BL[k+1]-BL[m] and back side word line BWL[0]. Similarly, memory row R[1] comprises a first segment including memory cells MC electrically coupled to front side word line WL[1] and a second segment including memory cells MC electrically coupled to back side word line BWL[1], memory row R[2] comprises a first segment including memory cells MC electrically coupled to front side word line WL[2] and a second segment including memory cells MC electrically coupled to back side word line BWL[2], or the like. In the example configuration in FIG. 1A, the first segments of the memory rows R[0], R[1], R[2], or the like, have the same number of memory cells MC and configure a first segment or first bank 111 of the memory array 101, and the second segments of the memory rows R[0], R[1], R[2], or the like, have the same number of memory cells MC and configure a second segment or second bank 112 of the memory array 101. Other configurations where the first segments or second segments of different memory rows have different numbers of memory cells MC are within the scopes of various embodiments. In at least one embodiment, the number of memory cells MC in the first segment of a memory row is the same as a number of memory cells MC in the second segment of the memory row, i.e., m=2k. Other configurations where the number of memory cells MC in the first segment of a memory row is different from the number of memory cells MC in the second segment of the memory row, are within the scopes of various embodiments.

Each of the memory rows R[0], R[1], R[2], or the like, further comprises a dummy memory cell DMC between the corresponding first segment and second segment. The dummy memory cells DMC of the memory rows R[0], R[1], R[2], or the like, are electrically coupled to bit line BL[k], and configure a dummy memory column 113 between the first bank 111 and second bank 112 of the memory array 101. In at least one embodiment, a dummy memory cell DMC has the same configuration as a memory cell MC; however, data read from dummy memory cells DMC in a read operation as described herein are ignored. In the example configuration in FIG. 1A, the dummy memory cells DMC are electrically coupled to the front side word lines WL[0], WL[1], WL[2], or the like. Other configurations are within the scopes of various embodiments. For example, in at least one embodiment, the dummy memory cells DMC are electrically coupled to the back side word lines BWL[0], BWL[1], BWL[2], or the like. In some embodiments, at least one dummy memory cell DMC is electrically coupled to a corresponding front side word line, whereas at least one further dummy memory cell DMC is electrically coupled to a corresponding back side word line. In some embodiments, a dummy memory cell is configured to separate shared VG vias (described hereinafter) between adjacent memory cells. A purpose is to avoid a potential situation in which, when the corresponding word line is accessed, an edge memory cell between a first segment and a second segment of the memory array is half-opened (e.g., with one pass gate turned ON) which, in turn, would not result in a functional bit cell operation.

For each of the memory rows R[0], R[1], R[2], or the like, the front side word line is electrically coupled to the back side word line, and to an output of a corresponding word line driver. For example, for memory row R[0], the front side word line WL[0] is electrically coupled to the back side word line BWL[0], and to an output of the corresponding word line driver 130. In the example configuration in FIG. 1A, the word line driver 130 comprises an inverter. Other word line driver configurations are within the scopes of various embodiments. In an access operation, e.g., a read operation or a write operation, a driving signal WLB(0) corresponding to a decoded row address of one or more memory cells MC selected to be accessed in the memory row R[0] is applied to an input of the word line driver 130. In response to the driving signal WLB(0), the word line driver 130 is configured to apply an access voltage WL(0), which corresponds to an inverted signal of the driving signal WLB(0), to the front side word line WL[0] and back side word line BWL[0] to access the selected more memory cells MC in the memory row R[0]. Similarly, for the memory row R[1], the corresponding word line driver 131 is configured to receive a driving signal WLB(1) and output an access voltage WL(1) to the front side word line WL[1] and back side word line BWL[1]. For the memory row R[2], the corresponding word line driver 132 is configured to receive a driving signal WLB(2) and output an access voltage WL(2) to the front side word line WL[2] and back side word line BWL[2].

As can be seen in FIG. 1A, the farther a memory cell MC in a memory row is from the corresponding word line driver, the longer distance the access voltage has to travel from the word line driver to the memory cell MC. With an increased physical distance between a memory cell MC and the corresponding word line driver, the resistance and capacitance associated with a length of the corresponding word line between the memory cell MC and the word line driver are also increased which, in turn, increase the timing delay (RC) and potentially limit the access speed (e.g., read speed or write speed) of the memory device. In one or more embodiments, such concerns are addressed by a fly word line configuration which comprises using both a front side word line and a back side word line to access a memory row.

For example, the back side word line BWL[0] in FIG. 1A is a fly word line which comprises a first section 115 extending under the first segment of the memory row R[0] in the first bank 111, without being electrically coupled to the memory cells MC in the first segment. In other words, the first section 115 of the back side word line BWL[0] "flies" over the first segment of the memory row R[0]. The back side word line BWL[0] further comprises a second section 116 contiguous to the first section 115. The second section 116 extends under the second segment of the memory row R[0] in the second bank 112, and is electrically coupled to the memory cells MC in the second segment. The front side word line WL[0] is electrically coupled to the memory cells MC in the first segment of the memory row R[0] in the first bank 111. The front side word line WL[0] is physically shorter than the back side word line BWL[0], and does not extend into the second bank 112. In other words, the second section 116 of the back side word line BWL[0] extends continuously from the first section 115 and beyond the front side word line WL[0]. The memory cells MC in the first segment of the memory row R[0] are accessed by the front side word line WL[0], whereas the memory cells MC in the second segment of the memory row R[0] are accessed by the back side word line BWL[0]. The described fly word line configuration is also implemented for the other memory rows. For example, for the memory row R[1], the back side word line BWL[1] is a fly word line, and the front side word line WL[1] is a shortened word line. For the memory row R[2], the back side word line BWL[2] is a fly word line, and the front side word line WL[2] is a shortened word line. Other fly word line configurations are within the scopes of various embodiments, as described herein, for example, with respect to FIGS. 1B-1C.

Because the first section 115 of the back side word line BWL[0] flies over the memory cells in the first segment without being electrically coupled thereto, at least capacitance associated with the first section 115 is reduced. As a result, in at least one embodiment, word line loading associated with the back side word line BWL[0] and the timing delay RC for accessing the memory cells MC in the second segment are reduced, and the access speed for the memory cells MC in the second segment is improved. Further, because the front side word line WL[0] is physically shorter and does not extend into the second bank 112, resistance and capacitance associated with the front side word line WL[0] are reduced. As a result, in at least one embodiment, word line loading associated with the front side word line WL[0] is reduced which, together with the reduced word line loading associated with the back side word line BWL[0], reduces loading on the word line driver 130 and improves performance and/or power consumption of the memory device 100A.

In some embodiments, the described advantages are achievable without one or more drawbacks of other approaches which use word lines on only one side of a memory array to access memory cells in the memory array. To address issues related to large timing delays when accessing memory cells at the far edge of the memory array, the other approaches implement word lines in multiple metal layers which increase the manufacturing cost and/or create additional parasitic capacitance. In contrast, in one or more embodiments, the described fly word line configuration with access to a memory array by both front side word lines and back side word lines, reduces timing delays, while also reducing word line capacitance, resistance, loading, or the like. In at least one embodiment, each of the front side word line and back side word line is formed in a single metal layer as described herein, which simplifies the manufacturing process and is an improvement over the other approaches.

Figures 1B, 1C:
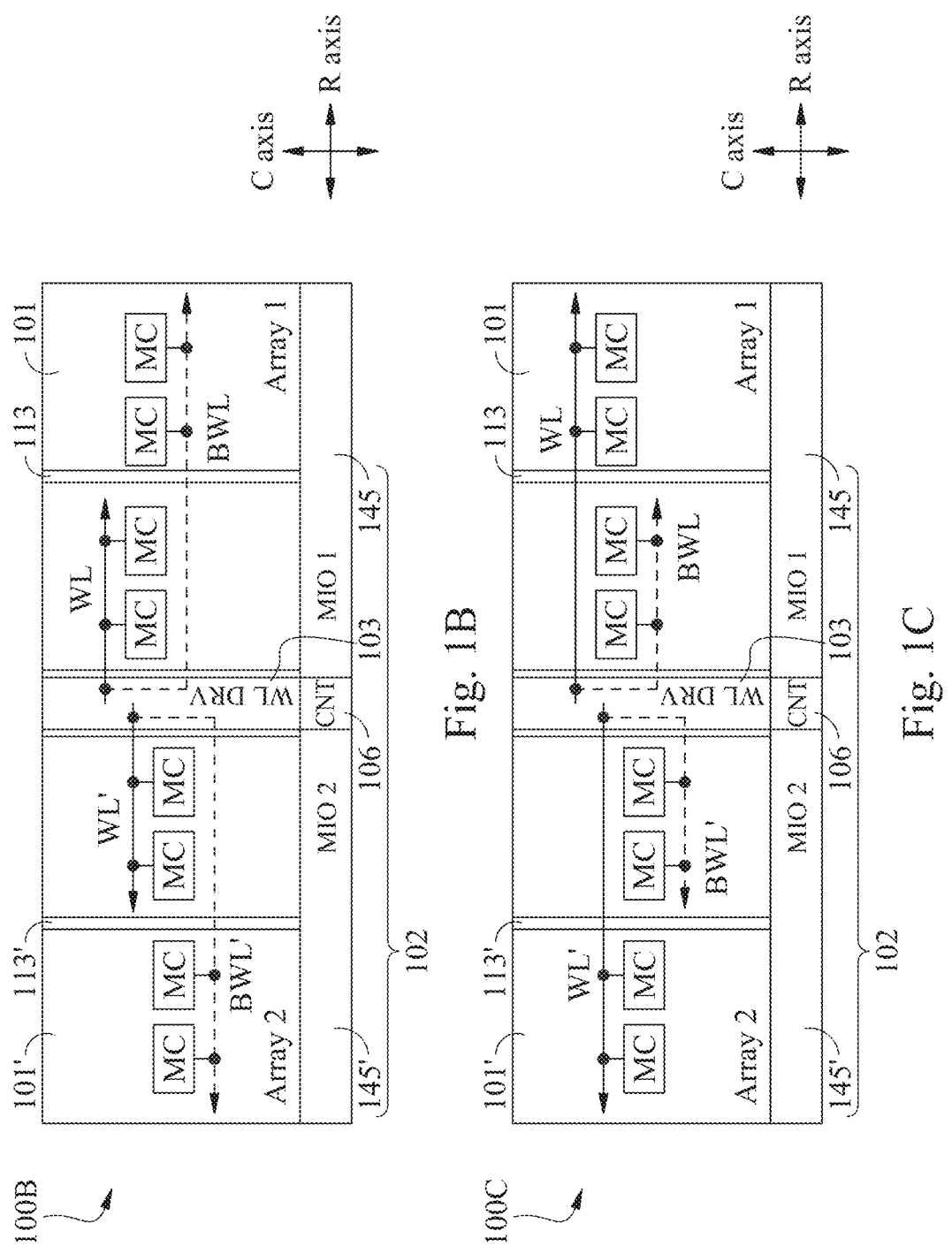

FIGS. 1B, 1C are schematic block diagrams of corresponding memory devices 100B, 100C, in accordance with some embodiments. For simplicity, corresponding components in FIGS. 1A-1C are designated by the same reference numerals.

In FIG. 1B, the memory device 100B comprises, in addition to the memory array 101 which is a first memory array (Array 1), a second memory array 101' (Array 2). The second memory array 101' is configured similarly to the first memory array 101, and is accessed by a fly word line configuration similar to that described with respect to the first memory array 101. The fly word line configurations for accessing the first memory array 101 and second memory array 101' are schematically illustrated in FIG. 1B correspondingly by a pair of a front side word line WL and a back side word line BWL, and a pair of a front side word line WL' and a back side word line BWL'. The second memory array 101' comprises a first bank (or proximal bank) accessed by the front side word line WL', a second bank (or distal bank) access by the back side word line BWL', and a dummy memory column 113' similar to the dummy memory column 113 and arranged between the first bank and the second bank of the second memory array 101'. A memory controller 102 of the memory device 100B comprises a word line driving circuit 103 (WL DRV), a control circuit 106 (CNT), a first input/output circuits 145 (MIO 1) associated with the first memory array 101, and a second input/output circuits 145' (MIO 2) associated with the second memory array 101'. The front side word lines and back side word lines in the memory arrays 101, 101' are electrically coupled to corresponding word line drivers in the word line driving circuit 103. The first input/output circuits 145 comprise the bit line multiplexers 104 and read/write circuits 105 associated with the first memory array 101. The second input/output circuits 145' similarly comprise bit line multiplexers and read/write circuits associated with the second memory array 101'.

In FIG. 1C, the memory device 100C comprises components similar to those described with respect to the memory device 100B. Compared to the memory device 100B which includes fly word lines at the back side, i.e., the back side word lines BWL, BWL' are fly word lines, the memory device 100C includes fly word lines at the front side, i.e., the front side word lines WL, WL' are fly word lines. In at least one embodiment, one or more advantages described herein with respect to the memory device 100A are achievable by one or more of the memory devices 100B, 100C.

The configurations described with respect to one or more of FIGS. 1A-1B are examples. Other configurations are within the scopes of various embodiments, while achieving one or more of the described advantages. For example, in at least one embodiment, one of the memory arrays 101, 101' includes fly word lines at the front side, whereas the other of the memory arrays 101, 101' includes fly word lines at the back side. In one or more embodiments, in the same memory array, at least one memory row is accessed by a fly word line configuration with the fly word line at the back side, whereas at least one further memory row is accessed by a fly word line configuration with the fly word line at the front side.

Figure 2:
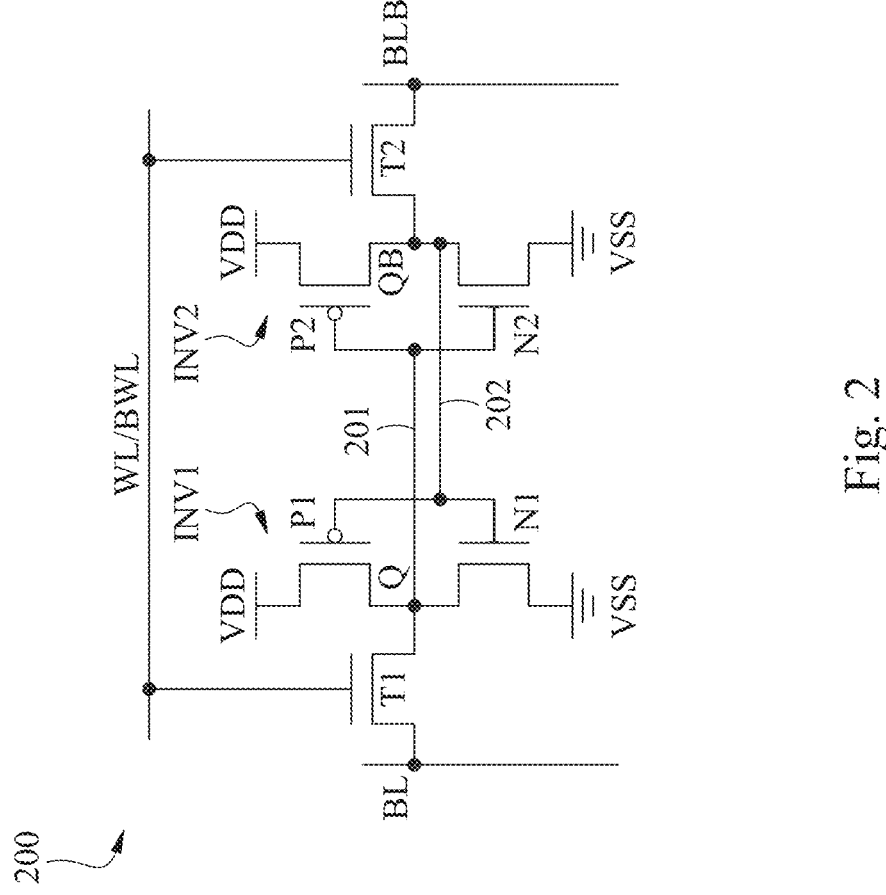
FIG. 2 is a schematic circuit diagram of a memory cell, in accordance with some embodiments.

FIG. 2 is a schematic circuit diagram of a memory cell 200, in accordance with some embodiments. In some embodiments, the memory cell 200 corresponds to one or more of the memory cells MC in one or more of the memory devices 100A, 100B, 100C. In the example configuration in FIG. 2, the memory cell 200 is a SRAM cell comprising six transistors (6T) and is sometimes referred to as a 6T SRAM cell. Other memory types and/or other SRAM cell configurations, such as 4T SRAM, 8T SRAM, 10T SRAM, 12T SRAM, or the like, are within the scopes of various embodiments.

The memory cell 200 comprises a first inverter INV1 comprising a pair of a P-type transistor P1 and an N-type transistor N1, a second inverter INV2 comprising a pair of a P-type transistor P2 and an N-type transistor N2, and access transistors or pass gates T1, T2. In the example configuration in FIG. 2, transistors T1, T2 are N-type transistors. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Other transistor configurations are within the scopes of various embodiments.

The inverters INV1, INV2 are cross-coupled to each other to form a latching circuit for data storage. For example, a cross-coupling connection 201 electrically couples an output (node Q) of the first inverter INV1 to an input of the second inverter INV2, and a cross-coupling connection 202 electrically couples an input of the first inverter INV1 to an output (node QB) of the second inverter INV2. The input of the first inverter INV1 is configured by gates of transistor P1 and transistor N1, and the output Q of the first inverter INV1 is configured by electrically coupled first source/drains of transistor P1 and transistor N1. The input of the second inverter INV2 is configured by gates of transistor P2 and transistor N2, and the output QB of the second inverter INV2 is configured by electrically coupled first source/drains of transistor P2 and transistor N2. Second terminals of transistor P1 and transistor P2 are electrically coupled to a power supply VDD, while second terminals of transistor N1 and transistor N2 are electrically coupled to a reference voltage, for example, the ground voltage VSS. A bit of data is stored in the memory cell 200 as a voltage level at the node Q, which is accessible by a memory controller via a bit line BL. Access to the node Q is controlled by transistor T1 which is electrically coupled between the bit line BL and the node Q. The node QB stores a bit of data which is the complement to the bit of data stored at the node Q, e.g., when the node Q is at a logic "high," the node QB is at a logic "low," and vice versa. The node QB is accessible by the memory controller via a bit line BLB. Access to the node QB is controlled by transistor T2 which is electrically coupled between a bit line BLB and the node QB. Gates of transistor T1 and transistor T2 are electrically coupled to a word line which, in one or more embodiments, is a front side word line WL or a back side word line BWL.

In at least one embodiment as described herein, transistor P1 and transistor N1 are configured by a first CFET device, transistor P2 and transistor N2 are configured by a second CFET device, transistor T1 is configured by a part of a third CFET device, and transistor T2 is configured by a part of a fourth CFET device.

Figures 3A, 3B:
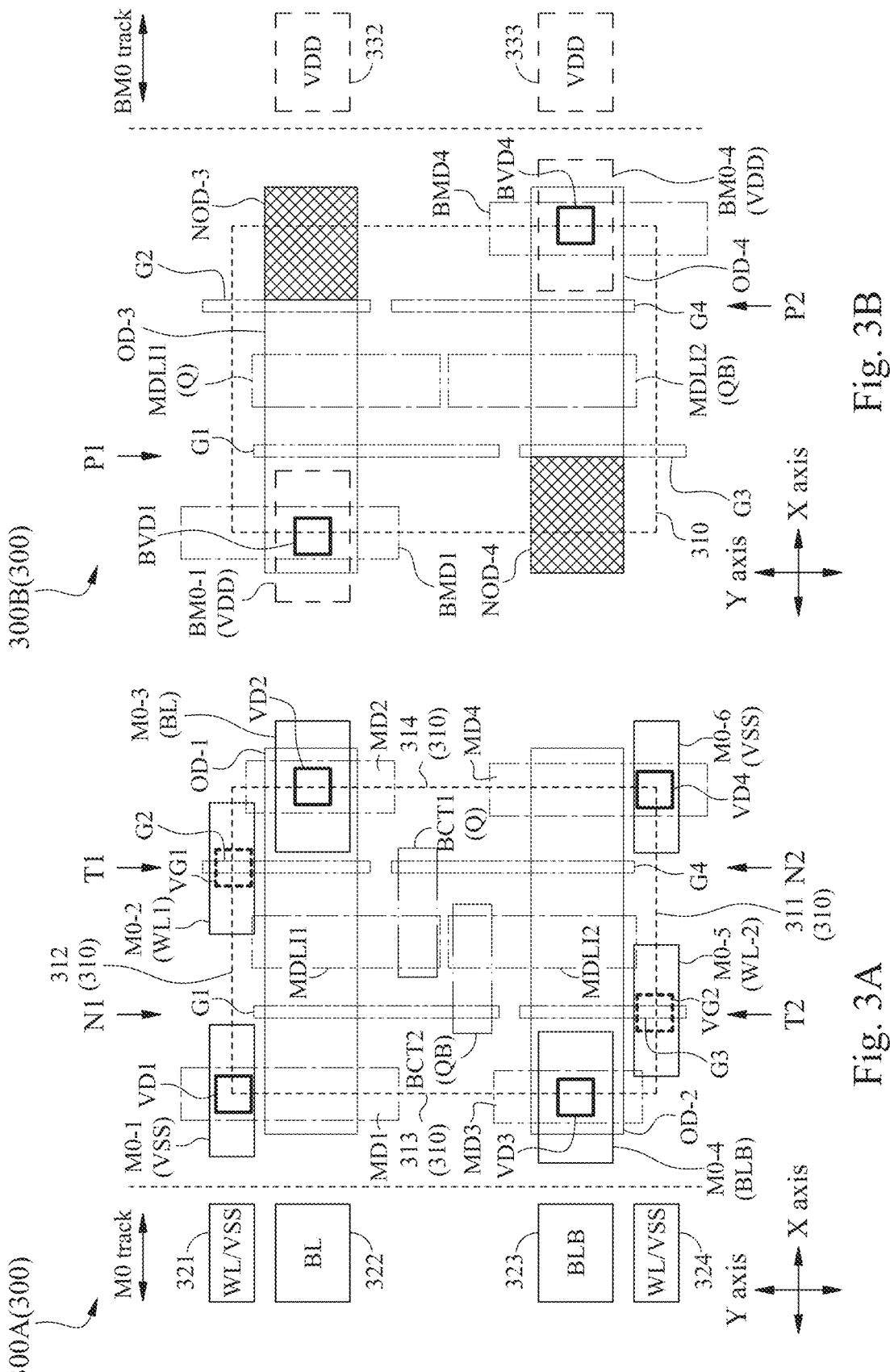
FIGS. 3A and 3B are correspondingly schematic views at a top layer and a bottom layer of a layout diagram of a memory cell.
Figure 3C:
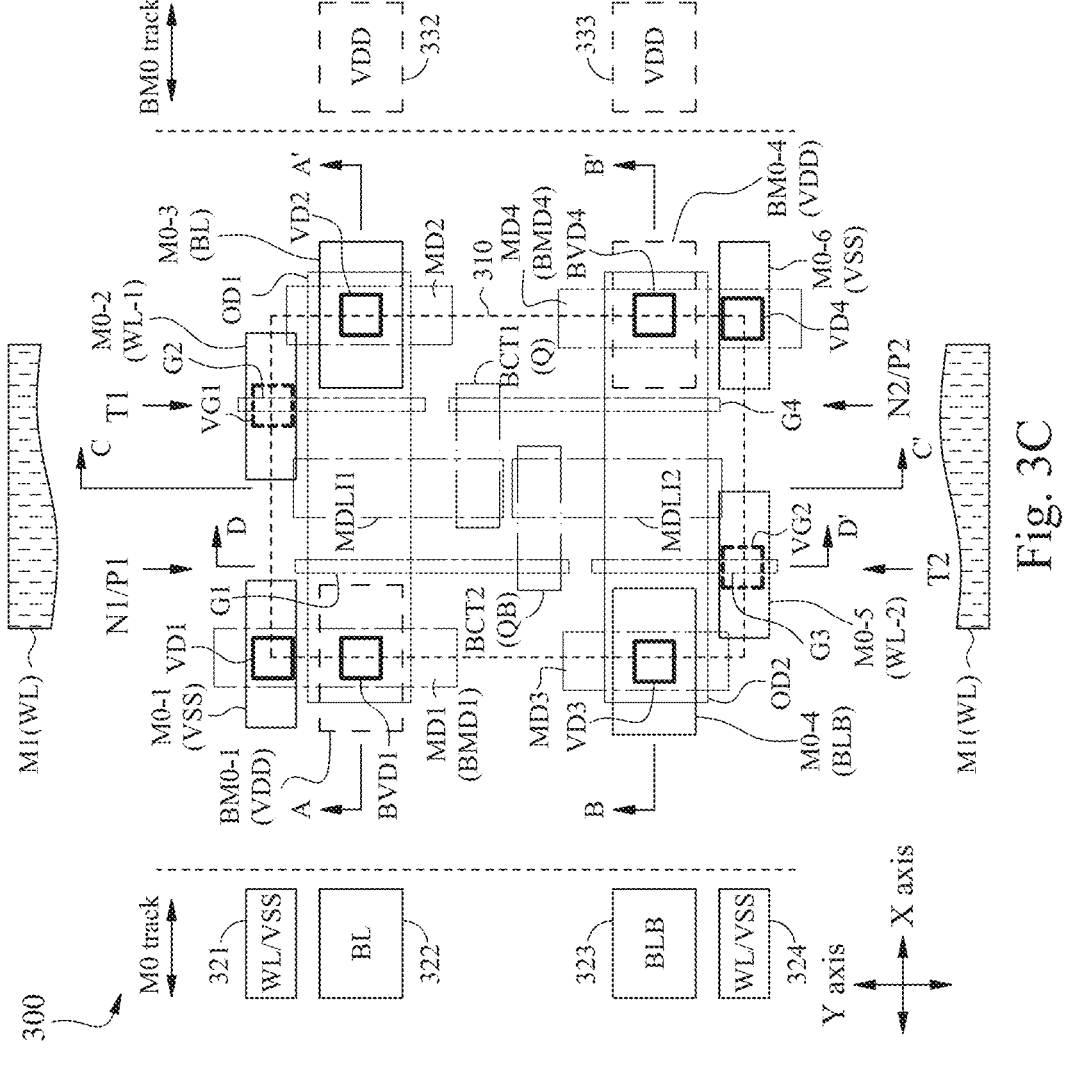
FIG. 3C is a schematic view of the layout diagram of the memory cell, in accordance with some embodiments.

FIGS. 3A and 3B are correspondingly schematic views at a top layer 300A and a bottom layer 300B of a layout diagram of a memory cell 300, and FIG. 3C is a schematic view of the layout diagram of the memory cell 300, in accordance with some embodiments. In some embodiments, the memory cell 300 corresponds to the memory cell 200, and/or to one or more of the memory cells MC in one or more of the memory devices 100A, 100B, 100C. In some embodiments, the layout diagram of the memory cell 300 is stored in a cell library and/or on a non-transitory computer readable recording medium.

In the example configuration in FIGS. 3A-3C, the memory cell 300 comprises CFET devices each comprising a top semiconductor device and a bottom semiconductor device. The top layer 300A (FIG. 3A) corresponds to top semiconductor devices, and the bottom layer 300B (FIG. 3B) corresponds to bottom semiconductor devices. The layout diagram in FIG. 3C is a combination of the top layer 300A stacked on the bottom layer 300B.

Referring to FIGS. 3A-3C, the memory cell 300 comprises a boundary 310 which is the same for both the top layer 300A, and the bottom layer 300B. The boundary 310 comprises edges 311, 312, 313, 314. The edges 311, 312 are elongated along an X axis, and the edges 313, 314 are elongated along a Y axis transverse to the X axis. The edges 311, 312, 313, 314 are connected together to form the closed boundary 310. In a place-and-route operation (also referred to as "automated placement and routing (APR)") described herein, cells are placed in an IC layout diagram in abutment with each other at their respective boundaries. The boundary 310 is sometimes referred to as "place-and-route boundary" or "prBoundary." The rectangular shape of the boundary 310 is an example. Other boundary shapes for various cells are within the scope of various embodiments. The memory cell 300 is within the boundary 310.

The top layer 300A comprises a layout of top semiconductor devices of a first type, and the bottom layer 300B comprises a layout of corresponding bottom semiconductor devices of a second type different from the first type. In some embodiments, the first type is one of a P-type and an N-type, and the second type is the other of the P-type and N-type. In the example configuration in FIGS. 3A-3C, the top layer 300A comprises N-type transistors, such as NMOSs, and the bottom layer 300B comprises P-type transistors, such as PMOSs.

Each of the top layer 300A and bottom layer 300B comprises at least one active region. Active regions are sometimes referred to as oxide-definition (OD) regions or source/drain regions, and are schematically illustrated in the drawings with labels including "OD." For example, the top layer 300A comprises active regions OD-1, OD-2, and the bottom layer 300B comprises active regions OD-3, OD-4. In the layout diagram in FIG. 3C, the active regions OD-1 and OD-3 overlap each other, or are stacked one over another, along a thickness direction of a substrate as described herein, and are commonly referred to as an active region OD1. Similarly, the active regions OD-2 and OD-4 overlap each other, or are stacked one over another, along the thickness direction of the substrate, and are commonly referred to as an active region OD2.

The active regions OD-1, OD-2, OD-3, OD-4 are over a first side, or a front side, of the substrate as described herein. The active regions OD-1, OD-2, OD-3, OD-4 are elongated along the X axis. The active regions OD-1, OD-2, OD-3, OD-4 include P-type dopants or N-type dopants to form one or more circuit elements or semiconductor devices. An active region configured to form one or more PMOS devices is sometimes referred to as "PMOS active region," and an active region configured to form one or more NMOS devices is sometimes referred to as "NMOS active region." In the example configuration described with respect to FIGS. 3A-3C, the active regions OD-1, OD-2 comprise NMOS active regions, and the active regions OD-3, OD-4 comprise PMOS active regions.

The top layer 300A further comprises a plurality of gate regions G1-G4 which overlap, or are stacked along the thickness direction of the substrate over, corresponding gate regions in the bottom layer 300B. Each of the gate regions G1-G4 in the top layer 300A is further electrically coupled to the corresponding, underlying gate region in the bottom layer 300B. The gate regions in FIGS. 3A-3C are commonly designated as gate regions G1-G4. The described configuration in which a gate region in the top layer 300A is electrically coupled to a underlying gate region in the bottom layer 300B is an example. In at least one embodiment, a gate region in the top layer 300A overlaps, but is electrically isolated from a underlying gate region in the bottom layer 300B. The gate regions G1-G4 are elongated along the Y axis. The gate regions G1-G4 comprise a conductive material, such as, polysilicon, metals, or the like.

The top layer 300A further comprises a plurality of top semiconductor devices configured by the gate regions G1-G4 and the active regions OD-1, OD-2. Specifically, the gate region G1 and the active region OD-1 configure an NMOS corresponding to transistor N1, the gate region G2 and the active region OD-1 configure an NMOS corresponding to transistor T1, the gate region G3 and the active region OD-2 configure an NMOS corresponding to transistor T2, and the gate region G4 and the active region OD-2 configure an NMOS corresponding to transistor N2.

The bottom layer 300B further comprises a plurality of bottom semiconductor devices configured by the gate regions G1, G4 and the active regions OD-3, OD-4. Specifically, the gate region G1 and the active region OD-3 configure a PMOS corresponding to transistor P1, and the gate region G4 and the active region OD-4 configure a PMOS corresponding to transistor P2. The transistor N1 and the underlying transistor P1 configure a CFET device corresponding to the gate region G1, and transistor N2 and the underlying transistor P2 configure a further CFET device corresponding to the gate region G4.

The bottom layer 300B further comprises regions NOD-3, NOD-4 correspondingly underlying the active regions OD-1, OD-2, but are not configured to form PMOSs. In some embodiments, the regions NOD-3, NOD-4 comprises no epitaxy structures. The region NOD-3 and the active region OD-3 are arranged, along the X axis, on opposite sides of the gate region G2. Within the boundary 310, the active region OD-1 overlaps a combination of the active region OD-3 and region NOD-3. Had the region NOD-3 been configured as a PMOS active region, a PMOS would have been formed by the gate region G2, active region OD3 and region NOD-3. Because the region NOD-3 is not configured to form a PMOS, no PMOS is formed in the bottom layer 300B under transistor T1 in the top layer 300A. A CFET device corresponding to the gate region G2 includes an NMOS, i.e., transistor T1, but no PMOS. Similarly, the region NOD-4, which is not configured to form a PMOS, and the active region OD-4 are arranged, along the X axis, on opposite sides of the gate region G3, and a CFET device corresponding to the gate region G3 includes an NMOS, i.e., transistor T2, but no PMOS.

The memory cell 300 further comprises source/drain contacts over and in electrical contact with corresponding source/drains in the active regions OD-1, OD-2, OD-3, OD-4. Source/drain contacts are sometimes referred to as metal-to-device (MD) contacts, and are schematically designated in the drawings with labels including "MD." Source/drain contacts of top semiconductor devices at the top layer 300A are sometimes referred to as MD contacts. Source/drain contacts of bottom semiconductor devices at the bottom layer 300B are sometimes referred to as BMD contacts. For simplicity, an MD contact herein refers to either an MD contact at the top layer or a BMD contact at the bottom layer, unless specified otherwise. An MD contact includes a conductive material over a corresponding source/drain in the corresponding active region to define an electrical connection from one or more devices formed in the active region to other internal circuitry of a memory device, an IC device including the memory device, or to outside circuitry. MD contacts are arranged alternatingly with the gate regions along the X axis. At the top layer 300A in FIG. 3A, each of MD contacts MD1-MD4 is on a corresponding source/drain of one of transistors N1, T1, T2, N2. At the bottom layer 300B in FIG. 3B, each of BMD contacts BMD1, BMD4 is on a corresponding source/drain of one of transistors P1, P2. The MD contacts MD1, MD4 correspondingly overlap, but are electrically isolated from, the BMD contacts BMD1, BMD4.

The memory cell 300 further comprises source/drain local interconnects (MDLIs). An interconnect MDLI is a conductive structure electrically coupling an MD contact with a underlying BMD contact. In the example configuration in FIGS. 3A-3C, each interconnect MDLI replaces the corresponding MD contact and BMD contact, and is in physical and electrical contact with both a source/drain in the top layer 300A and a underlying source/drain in the bottom layer 300B. Specifically, the memory cell 300 comprises interconnect MDLI1 electrically coupling a common source/drain of transistor N1 and transistor T1 at the top layer 300A to a underlying source/drain of transistor P1 at the bottom layer 300B. The memory cell 300 further comprises interconnect MDLI2 electrically coupling a common source/drain of transistor N2 and transistor T2 at the top layer 300A to a second source/drain of transistor P2 at the bottom layer 300B.

The memory cell 300 further comprises bridge interconnects (BCTs). An interconnect BCT is a conductive structure electrically coupling an interconnect MDLI with an adjacent gate region. Specifically, the memory cell 300 comprises interconnect BCT1 electrically coupling the gate region G4 to the interconnect MDLI1, and interconnect BCT2 electrically coupling the gate region G1 to the interconnect MDLI2. The interconnects MDLI1, BCT1 correspond to the node Q, and the interconnects MDLI2, BCT2 correspond to the node QB. In the example configuration in FIG. 3A, the interconnects BCT1, BCT2 are included in the top layer 300A. In some embodiments, at least one of the interconnects BCT1, BCT2 is included in the bottom layer 300B.

The top layer 300A further comprises vias over and in electrical contact with gate regions and MD contacts. A via over and in electrical contact with an MD contact is sometimes referred to as via-to-device (VD) via. A via over and in electrical contact with a gate is sometimes referred to as via-to-gate (VG) via. VD and VG vias are schematically illustrated in the drawings with the corresponding labels including "VD" and "VG." In the example configuration in FIG. 3A, vias VG1, VG2 are correspondingly over the gate regions G2, G3, and vias VD1-VD4 are correspondingly over MD contacts MD1-MD4.

Similarly, the bottom layer 300B comprises back side VD and/or VG vias in electrical contact with corresponding BMD contacts and/or gate regions. Back side VD and VG vias are schematically illustrated in the drawings with the corresponding labels including "BVD" and "BVG." In the example configuration in FIG. 3B, vias BVD1, BVD4 are correspondingly on BMD contacts BMD1, BMD4. An example material of VD, VG, BVD, BVG vias includes metal. Other configurations are within the scopes of various embodiments.

The top layer 300A further comprises a plurality of metal layers and via layers sequentially and alternatingly arranged over the VD, VG vias. The lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like.

Similarly, the bottom layer 300B comprises a plurality of back side metal layers and a plurality of back side via layers arranged sequentially and alternatingly under the BVD, BVG vias. The back side metal layer closest to the front side (or to the active regions OD-3, OD-4) is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like.

In the example configuration in FIG. 3A, the top layer 300A comprises M0 conductive patterns M0-1 to M0-6 correspondingly over vias VD1, VG1, VD2, VD3, VG2, VD4. The M0 conductive patterns M0-1, M0-6 are configured to be electrically coupled to one or more VSS power rails. The M0 conductive patterns M0-2, M0-5 are configured to be electrically coupled to a front side word line WL described with respect to FIG. 3C. The M0 conductive patterns M0-2, M0-5 are designated as WL-1, WL-2. The M0 conductive patterns M0-3, M0-4 are configured to be electrically coupled correspondingly to bit lines BL, BLB. FIG. 3A further shows usage of M0 tracks 321-324 in the top layer 300A. The M0 track 321 is configured for VSS and a word line, and M0 conductive pattern M0-1 for VSS and M0 conductive pattern M0-2 for a word line WL are arranged along the M0 track 321. The M0 track 322 is configured for a bit line BL, and M0 conductive pattern M0-3 for the bit line BL is arranged along the M0 track 322. The M0 track 323 is configured for another bit line BLB, and M0 conductive pattern M0-4 for the bit line BLB is arranged along the M0 track 323. The M0 track 324 is configured for VSS and the word line, and M0 conductive pattern M0-6 for VSS and M0 conductive pattern M0-5 for the word line WL are arranged along the M0 track 324.

In the example configuration in FIG. 3B, the bottom layer 300B comprises BM0 conductive patterns BM0-1, BM0-4 correspondingly on vias BVD1, BVD4. The BM0 conductive pattern BM0-1, BM0-4 are configured to be electrically coupled to one or more VDD power rails. FIG. 3B further shows usage of BM0 tracks 332, 333 in the bottom layer 300B. The BM0 tracks 332, 333 are configured for VDD, and BM0 conductive patterns BM0-1, BM0-4 for VDD are arranged correspondingly along the BM0 tracks 332, 333.

In the example configuration in FIGS. 3A-3C, the edge 311 of the boundary 310 is along the M0 track 324, and coincides with centerlines of M0 conductive patterns M0-5, M0-6. The edge 312 of the boundary 310 is along the M0 track 321, and coincides with centerlines of M0 conductive patterns M0-1, M0-2. The edge 313 of the boundary 310 coincides with centerlines of MD contacts MD1, MD3 and BMD contact BMD1. The edge 314 of the boundary 310 coincides with centerlines of MD contacts MD2, MD4 and BMD contact BMD4.

In FIG. 3C, in addition to various components described with respect to FIGS. 3A, 3B, the memory cell 300 further comprises a front side word line WL configured in the M1 layer. The front side word line WL comprises an M1 conductive pattern which extends continuously along the Y axis over a whole height of the memory cell 300. For simplicity, a portion of the front side word line WL over the memory cell 300 is not illustrated. Although not illustrated in FIG. 3C, the front side word line WL further extends continuously over other memory cells placed along the Y axis in abutment with each other or in abutment with the memory cell 300. In the example configuration in FIG. 3C, the Y axis corresponds to the R axis described with respect to FIGS. 1A-1C.

The memory cell 300 further comprises two V0 vias (not shown) correspondingly over the M0 conductive patterns M0-2, M0-5 to electrically couple the front side word line WL to the M0 conductive patterns M0-2, M0-5, then to the vias VG1, VG2, then to the gate regions G2, G3 of the access transistors T1, T2. In at least one embodiment, in response to an access voltage applied to the front side word line WL, the access transistors T1, T2 are turned ON, and permit access to a datum stored in the memory cell 300. The memory cell 300 is an example of a memory cell electrically coupled to, and accessible through, a front side word line. An example of a memory cell electrically coupled to, and accessible through, a back side word line is described with respect to FIGS. 5-6. In at least one embodiment, one or more advantages described herein are achievable by a memory device comprising one or more memory cells 300.

FIGS. 4A-4D are schematic cross-sectional views of a portion of a memory device 400, in accordance with some embodiments. The portion of the memory device 400 in FIGS. 4A-4D corresponds to the memory cell 300. The views in FIGS. 4A and 4B correspond to X axis cross-sectional views taken along lines A-A' and B-B' in FIG. 3C. The views in FIGS. 4C and 4D correspond to Y axis cross-sectional views taken along lines C-C' and D-D' in FIG. 3C. For simplicity, corresponding components in FIGS. 3A-3C and 4A-4D are designated by the same reference numerals.

Figures 4A, 4B:
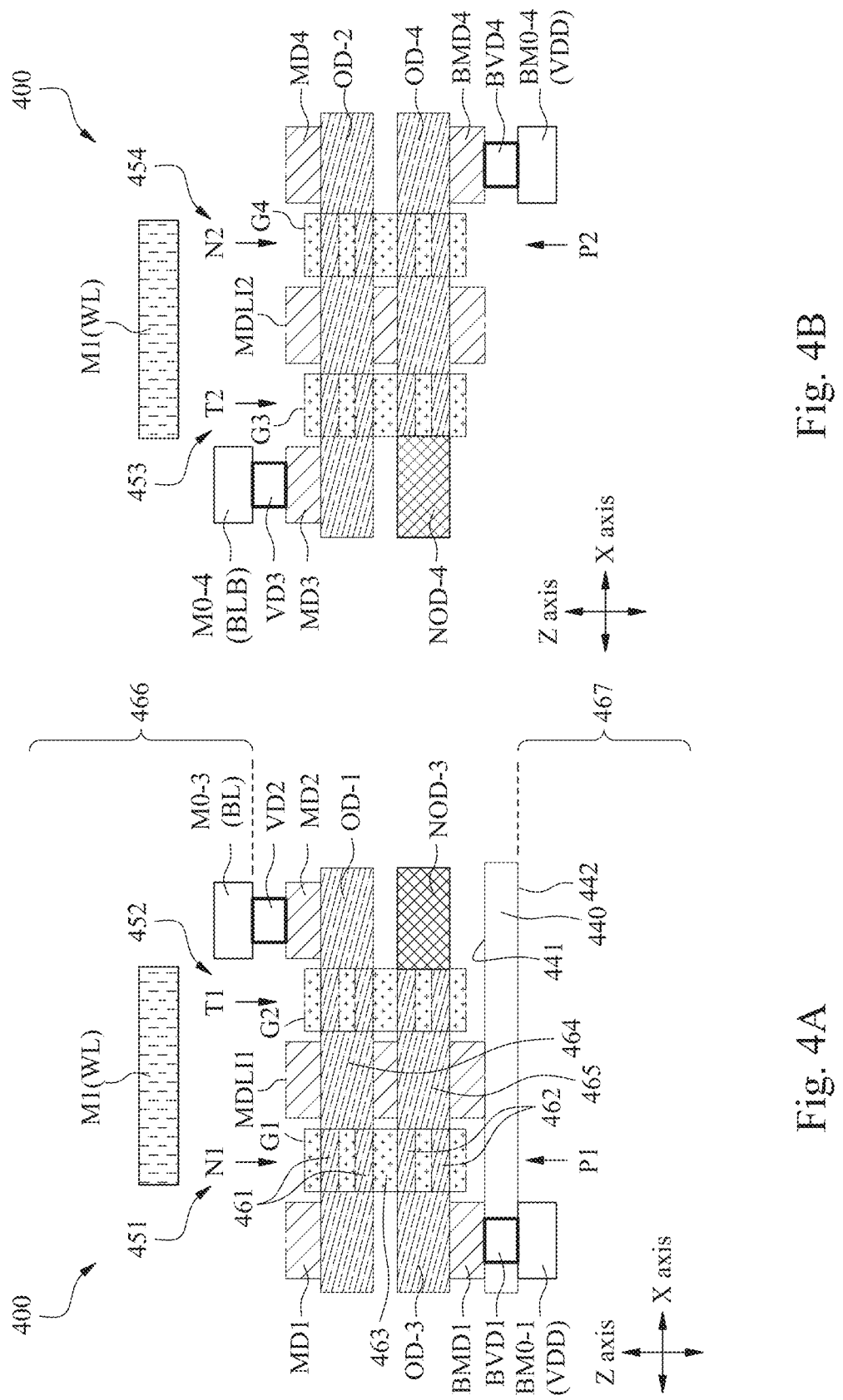
FIGS. 4A-4D are schematic cross-sectional views of a portion of a memory device, in accordance with some embodiments.

As illustrated in FIG. 4A, the memory device 400 comprises a substrate 440 having a front side 441, and a back side 442 opposite to the front side 441 in a thickness direction of the substrate 440. In at least one embodiment, the front side 441 is referred to as "first side," "upper side" or "device side," whereas the back side 442 is referred to as "second side," or "lower side." The thickness direction of the substrate 440 is also a thickness direction of the memory device 400, and is designated as Z axis in the drawings. In some embodiments, the substrate 440 comprises a semiconductor material, such as silicon, silicon germanium (SiGe), gallium arsenic, or other suitable semiconductor materials. In some embodiments, the substrate 440 comprises a dielectric material, such as silicon nitride, silicon oxide, ceramic, glass, or other suitable materials. In some embodiments, the substrate 440 comprises a multi-layer structure. In some embodiments, the substrate 440 is omitted, or comprises an insulation layer that replaces an initial semiconductor bulk used during manufacture. For simplicity, the substrate 440 is omitted in FIGS. 4B-4D.

The memory device 400 further comprises CFET devices 451-454 over the front side 441 of the substrate 440. The CFET devices 451-454 correspond to the gate regions G1-G4. The CFET devices 451, 452 are illustrated in FIG. 4A, and the CFET devices 453, 454 are illustrated in FIG. 4B. The CFET device 451 comprises transistor N1 as a top semiconductor device over transistor P1 as a bottom semiconductor device, and the CFET device 454 comprises transistor N2 as a top semiconductor device over transistor P2 as a bottom semiconductor device. In the CFET device 452, transistor T1 is a top semiconductor device, and a bottom semiconductor device is not formed due to the region NOD-3 not configured to form a PMOS as described herein. Similarly, in the CFET device 453, transistor T2 is a top semiconductor device, and a bottom semiconductor device is not formed due to the region NOD-2 not configured to form a PMOS as described herein. The top semiconductor devices, i.e., transistors N1, N2, T1, T2 are examples of semiconductor devices in an upper layer of the memory device 400, and the bottom semiconductor devices, i.e., transistors P1, P2 are examples of semiconductor devices in a lower layer of the memory device 400.

Each top semiconductor device or bottom semiconductor device comprises a channel which is arranged in a corresponding active region. In the example configuration in FIG. 4A, the channel of transistor N1 comprises a semiconductor material, such as Si, in the corresponding active region OD-1, and is configured as a plurality of N-type nanosheets 461 stacked over, while being spaced from, each other in the thickness direction. Similarly, the channel of transistor P1 comprises a semiconductor material, such as Si, in the corresponding active region OD-3, and is configured as a plurality of P-type nanosheets 462 stacked over, while being spaced from, each other in the thickness direction. The described channel material and nanosheets are examples. Other channel materials and/or channel types, such as nanowire, FinFET, planar, or the like, are within the scopes of various embodiments.

Each top semiconductor device or bottom semiconductor device further comprises a gate corresponding to one of the gate regions G1-G4. For simplicity, the gates in the memory device 400 are referred to by the same reference numerals G1-G4 of the corresponding gate regions in the memory cell 300. In some embodiments, the gates G1-G4 are metal gates. Other gate materials, such a polysilicon, are within the scopes of various embodiments. In the example configuration in FIGS. 4A-4B, the gates G1-G4 are all-around gates which extend around the corresponding channels. In some embodiments, the gate material of the gates G1-G4 replaces a sacrificial material, such as SiGe, in the corresponding active region during a manufacturing process.

In the example configurations in FIGS. 4A, 4B, the gate of a top semiconductor device in a CFET device is electrically coupled by a local interconnect to the gate of the underlying bottom semiconductor device in the same CFET device. For example, in the CFET device 451, the gate of transistor N1 is electrically coupled to the gate of transistor P1 by a local interconnect 463. In some embodiments, the local interconnect 463 is formed as an integral part of the gate G1 around the nanosheets 461, 462. Because the gate of transistor N1 is electrically coupled to the gate of transistor P1, the gates of transistors N1, P1 are commonly designated by the same reference numeral G1. In at least one embodiment, a CFET device comprises an isolated gate configuration in which the gate of the top semiconductor device is not electrically coupled by a local interconnect to the gate of the underlying bottom semiconductor device, i.e., a local interconnect similar to the local interconnect 463 is omitted in the isolated gate configuration.

Each top semiconductor device or bottom semiconductor device further comprises a gate dielectric (not shown) between the corresponding gate and channel. For example, in transistor N1, a gate dielectric is between the gate G1 and nanosheets 461, and extends around each of the nanosheets 461. Example materials of the gate dielectric include high-k dielectric materials, or the like.

Each top semiconductor device or bottom semiconductor device further comprises source/drains in the corresponding active region. For example, transistor N1 and transistor T1 share a common source/drain 464 in the active region OD-1, and transistor P1 comprises a source/drain 465 in the active region OD-3. In some embodiments, a source/drain comprises an epitaxy structure coupled to the adjacent nanosheets. For example, the source/drain 464 is coupled to the nanosheets 461, and the source/drain 465 is coupled to the nanosheets 462. In some embodiments, source/drains are grown by epitaxy processes.

The memory device 400 further comprises interconnects MDLI1, MDLI2 as described with respect to FIGS. 3A-3C. In the example configurations in FIG. 4A, the interconnect MDLI1 extends around and is electrically coupled to the source/drains 464, 465. The interconnect MDLI2 is similarly configured, as illustrated in FIG. 4B. An example material of interconnect MDLIs comprises a metal.

As can be seen in FIGS. 4A-4B, the memory device 400 further comprises various MD contacts, VD vias, VG vias on the front side, and BMD contacts, BVD vias, BVG vias on the back side, as described with respect to FIGS. 3A-3C. The memory device 400 further comprises a front side redistribution structure 466, and back side redistribution structure 467. The front side redistribution structure 466 is on the front side, over the VD, VG vias, and comprises various metal layers M0, M1, or the like, and via layers V0, V1 or the like, as described herein. The back side redistribution structure 467 is on the back side, under the BVD, BVG vias, and comprises various back side metal layers BM0, BM1, or the like, and back side via layers BV0, BV1 or the like, as described herein. In the example configuration in FIG. 4A, the via BVD1 extends through the substrate 440 from the back side 442 to the front side 441, to come in physical and electrical contact with the BMD contacts BMD1. The BM0 conductive pattern BM0-1 is on the back side 442 of the substrate 440, and is in physical and electrical contact with the via BVD1. Although not illustrated in FIG. 4A, a BVG via extends through the substrate 440 in a similarly manner, and electrically couples a gate on the front side with a BM0 conductive pattern on the back side. For simplicity, various metal layers and via layers in the front side redistribution structure 466 and back side redistribution structure 467 are omitted.

Figure 4D:
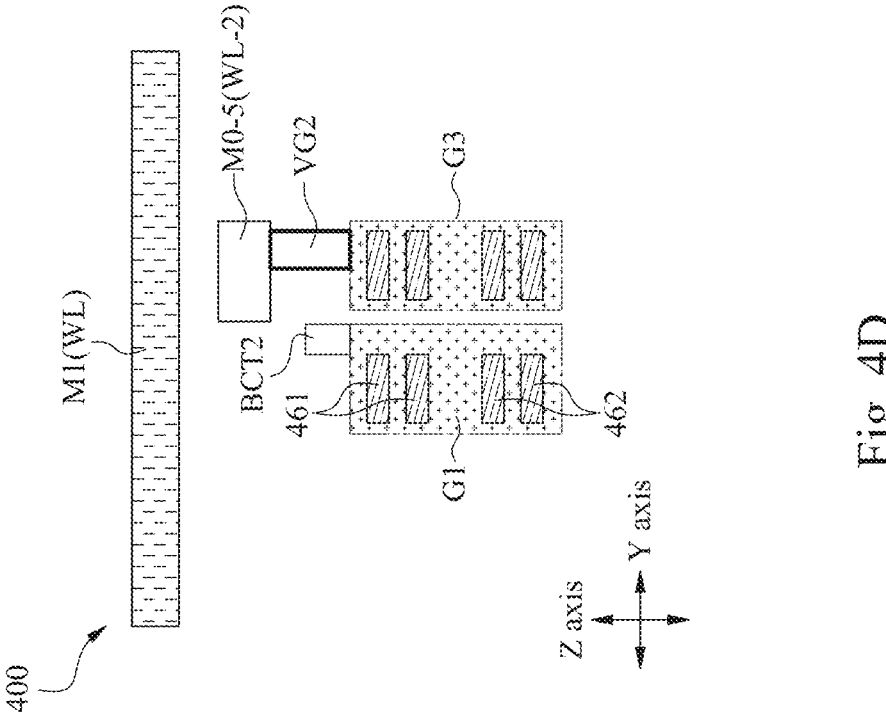
Figure 4C:
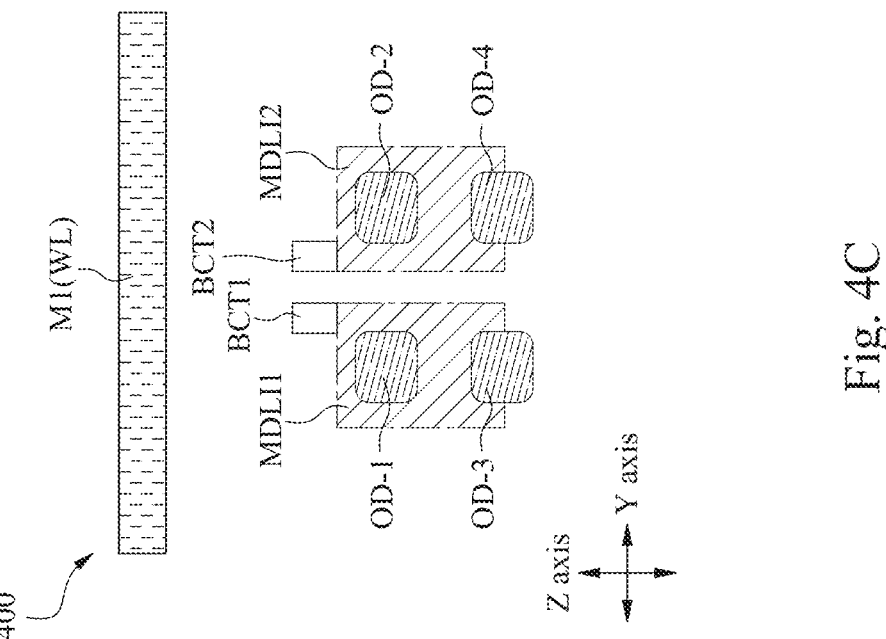

As can be seen in FIG. 4C, the memory device 400 comprises interconnects BCT1, BCT2 correspondingly over the interconnects MDLI1, MDLI2. As can be seen in FIG. 4D, the interconnect BCT2 is also over the gate G1. Thus, the interconnects BCT2 electrically couples the gate G1 to the interconnect MDLI2. Similarly although not illustrated, the interconnects BCT1 electrically couples the gate G4 to the interconnect MDLI1.

Although not illustrated in FIG. 4D, the memory device 400 comprises a V0 via electrically coupling the M0 conductive pattern M0-5 to the front side word line WL in the overlying M1 layer. In at least one embodiment, one or more advantages described herein are achievable by the memory device 400.

Figures 5, 6:
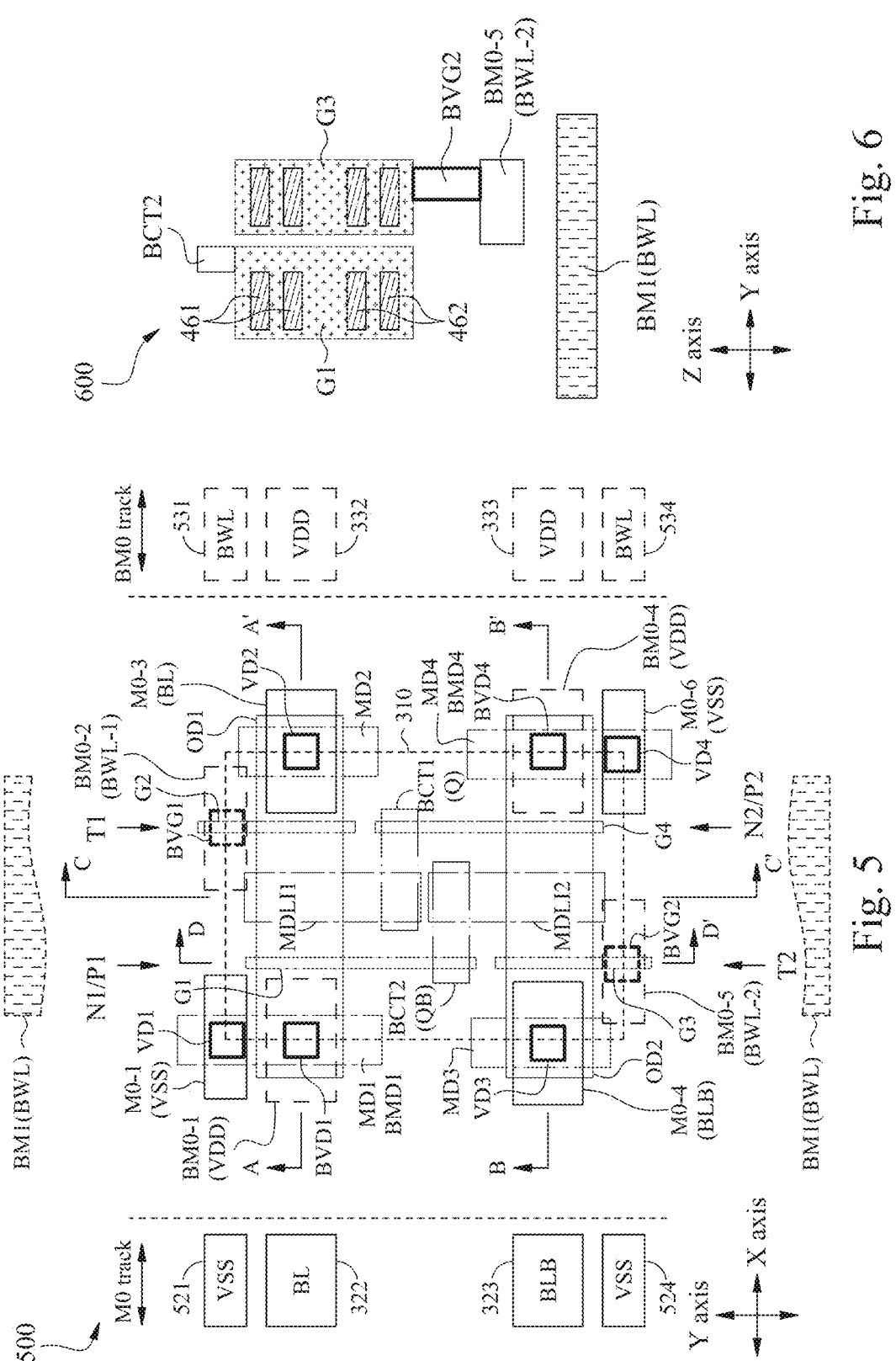
FIG. 5 is a schematic view of a layout diagram of a memory cell, in accordance with some embodiments.
FIG. 6 is a schematic cross-sectional view of a portion of a memory device, in accordance with some embodiments.

FIG. 5 is a schematic view of a layout diagram of a memory cell 500, in accordance with some embodiments. In some embodiments, the memory cell 500 corresponds to the memory cell 200, and/or to one or more of the memory cells MC in one or more of the memory devices 100A, 100B, 100C. In some embodiments, the layout diagram of the memory cell 500 is stored in a cell library and/or on a non-transitory computer readable recording medium. FIG. 5 is similar to FIG. 3C. For simplicity, components of the memory cell 500 having corresponding components in the memory cell 300 are designated by the same reference numerals of the memory cell 300, or by the reference numerals of the memory cell 300 increased by two hundred.

The memory cell 500 is an example of a memory cell electrically coupled to, and accessible through, a back side word line. This is different from the memory cell 300 which is an example of a memory cell electrically coupled to, and accessible through, a front side word line. Compared to the memory cell 300, the memory cell 500 comprises vias BVG1, BVG2, and BM0 conductive patterns BM0-2, BM0-5 instead of the vias VG1, VG2, and M0 conductive patterns M0-2, M0-5. An M0 track 521 in the memory cell 500 is different from the corresponding M0 track 321 in that the M0 track 521 is not configured for a word line. Instead, the memory cell 500 comprises a BM0 track 531 which is configured for a back side word line, and along which the BM0 conductive pattern BM0-2 (designated as BWL-1) is arranged. Further, an M0 track 524 in the memory cell 500 is different from the corresponding M0 track 324 in that the M0 track 524 is not configured for a word line. Instead, the memory cell 500 comprises a BM0 track 534 which is configured for the back side word line, and along which the BM0 conductive pattern BM0-5 (designated as BWL-2) is arranged.

The memory cell 500 further comprises a back side word line BWL configured in the BM1 layer. The back side word line BWL comprises an BM1 conductive pattern which extends continuously along the Y axis over a whole height of the memory cell 500. For simplicity, a portion of the back side word line BWL under the memory cell 500 is not illustrated. Although not illustrated in FIG. 5, the back side word line BWL further extends continuously over other memory cells placed along the Y axis in abutment with each other or in abutment with the memory cell 500. In the example configuration in FIG. 5, the Y axis corresponds to the R axis described with respect to FIGS. 1A-1C.

The memory cell 500 further comprises two BV0 vias (not shown) correspondingly over the BM0 conductive patterns BM0-2, BM0-5 to electrically couple the back side word line BWL to the BM0 conductive patterns BM0-2, BM0-5, then to the vias BVG1, BVG2, then to the gate regions G2, G3 of the access transistors T1, T2. In at least one embodiment, in response to an access voltage applied to the back side word line BWL, the access transistors T1, T2 are turned ON, and permit access to a datum stored in the memory cell 500. In at least one embodiment, one or more advantages described herein are achievable by a memory device comprising one or more memory cells 500.

FIG. 6 is a schematic cross-sectional view of a portion of a memory device 600, in accordance with some embodiments. The portion of the memory device 600 in FIG. 6 corresponds to the memory cell 500. The view in FIG. 6 is similar to the view in FIG. 4D, and corresponds to a Y axis cross-sectional view taken along line D-D' in FIG. 5. For simplicity, corresponding components in FIGS. 5 and 6 are designated by the same reference numerals.

As can be seen in FIG. 6, the BM0 conductive pattern BM0-5 is electrically coupled by the via BVG2 to the gate G3. The via BVG2 extends through a substrate (not shown) corresponding to the substrate 440. Although not illustrated in FIG. 6, the memory device 600 comprises a BV0 via electrically coupling the BM0 conductive pattern BM0-5 to the back side word line BWL in the underlying BM1 layer. Cross-sectional views of the memory device 600 along lines A-A', B-B', C-C' in FIG. 5 are correspondingly similar to the views in FIGS. 4A-4C, except that the front side word line WL in the M1 layer in FIGS. 4A-4C is replaced with the back side word line BWL in the BM1 layer. In at least one embodiment, one or more advantages described herein are achievable by the memory device 600.

Figure 7:
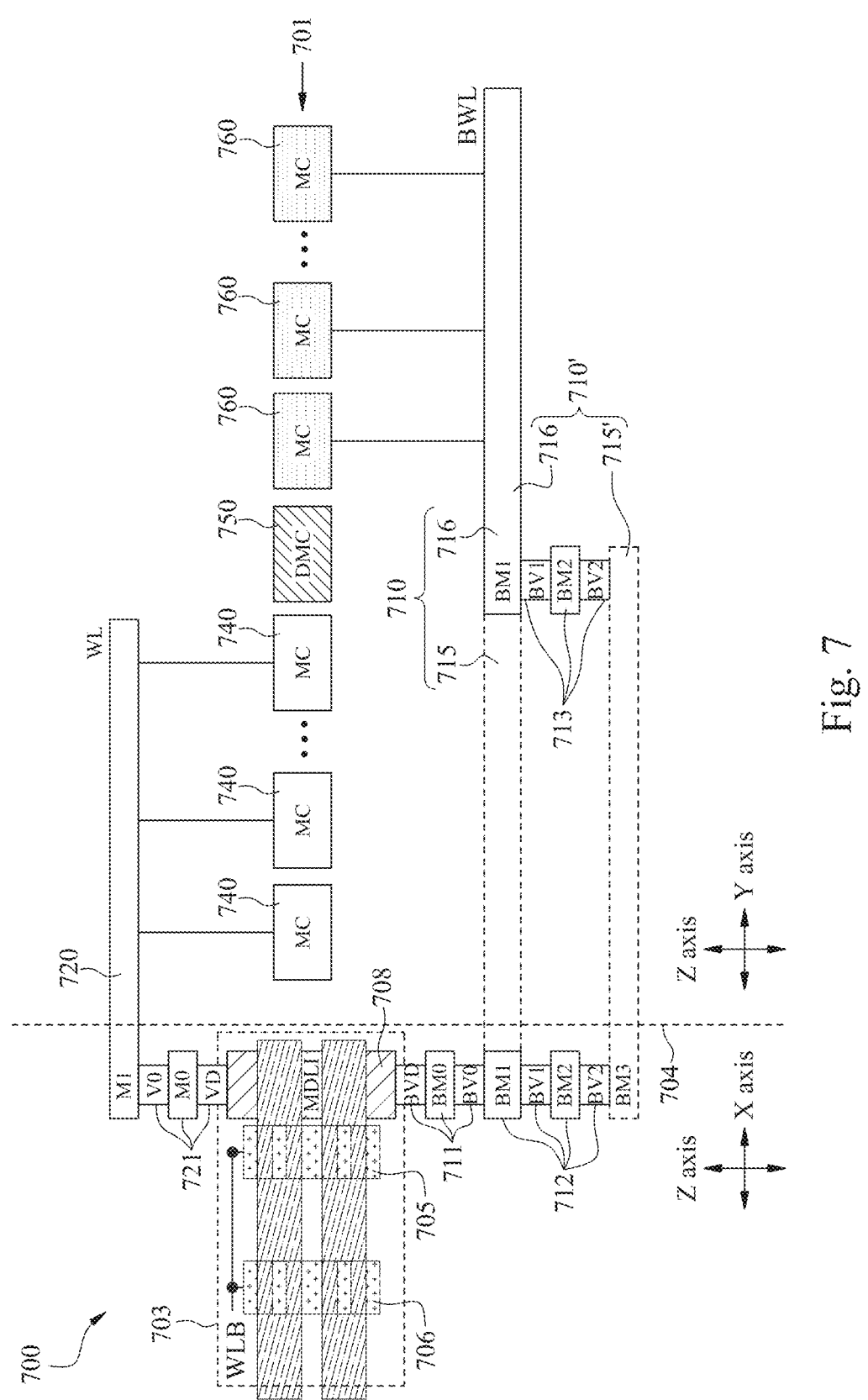
FIG. 7 is schematic cross-sectional view of a portion of a memory device, in accordance with some embodiments.

FIG. 7 is schematic cross-sectional view of a portion of a memory device 700, in accordance with some embodiments.

In some embodiments, the portion of the memory device 700 in FIG. 7 corresponds to a portion of one or more of the memory devices 100A-100C.

Specifically, the memory device 700 comprises a memory row 701 and a corresponding word line driver 703 electrically coupled to memory cells MC in the memory row 701 through a back side word line 710 and a front side word line 720. In some embodiments, the memory row 701 corresponds to one or more of the memory rows R[0], R[1], R[2], or the like, the word line driver 703 corresponds to one or more of the word line drivers 130, 131, 132, or the like, the back side word line 710 corresponds to one or more of the back side word lines BWL[0], BWL[1], BWL[2], or the like, and the front side word line 720 corresponds to one or more of the front side word lines WL[0], WL[1], WL[2], or the like. FIG. 7 is a combined view of an X axis cross-sectional view and a Y axis cross-sectional view. The X axis cross-sectional view is on the right side of a line 704, and shows the memory row 701 and the corresponding word lines 710, 720. The Y axis cross-sectional view is on the left side of the line 704, and shows the word line driver 703.

In the example configuration in FIG. 7, the word line driver 703 comprises a plurality of CFET devices coupled in a configuration referred to as a multi-finger driver. In such a configuration, each finger corresponds to a gate. For example, two gates 705, 706 are illustrated in FIG. 7, and correspond to two fingers of the word line driver 703. The number of gates/fingers and/or CFET devices in the word line driver 703 is not limited to a particular number and is determined, in one or more embodiments, based on an intended driving strength of the word line driver 703 which, in turn, depends on further factors including word line loading associated with the memory row 701. The CFET devices including the gates 705, 706 are configured as inverters. The gates 705, 706 are electrically coupled together to receive a driving signal WLB which, in one or more embodiments, corresponds to one or more of the driving signals WLB(0), WLB(1), WLB(2), or the like. The word line driver 703 is configured to, responsive to the driving signal WLB, output an access voltage (not numbered) at an MDLI interconnect 708 which is at the last inverter and which configures an output of the word line driver 703. The MDLI interconnect 708 is electrically coupled to the back side word line 710 by a connection 711 comprising a BVD via, a BM0 conductive pattern, and a BV0 via. The MDLI interconnect 708 is further electrically coupled to the front side word line 720 by a connection 721 comprising a VD via, an M0 conductive pattern, and a V0 via.

The memory row 701 comprises memory cells 740 in a first segment and electrically coupled to the front side word line 720, memory cells 760 in a second segment and electrically coupled to the back side word line 710, and a dummy memory cell 750 between the first segment and the second segment. In some embodiments, one or more of the memory cells 740 correspond the memory cell 300 and/or the portion of the memory device 400 described with respect to FIGS. 4A-4D, whereas the front side word line 720 corresponds to the front side word line WL described with respect to FIGS. 3C and 4A-4D. In some embodiments, one or more of the memory cells 760 correspond the memory cell 500 and/or the portion of the memory device 600 described with respect to FIGS. 5-6, whereas the back side word line 710 corresponds to the back side word line BWL described with respect to FIGS. 5-6.

The back side word line 710 comprises a first section 715, and a second section 716 continuous to the first section 715.

In some embodiments, the first section 715 and second section 716 correspond to the first section 115 and second section 116 of a back side word line described with respect to FIG. 1A. The first section 715 extends under the memory cells 740 and parallel to the front side word line 720, without being electrically coupled to the memory cells 740. In some embodiments, a layout diagram of each of the memory cells 740 is as shown in FIG. 3C, with the addition of a back side word line BWL in the BM1 layer as described with respect to FIG. 5, but the back side word line BWL is not electrically coupled to the gates G1-G4. In other words, the first section 715 flies over the memory cells 740. The second section 716 extends continuously from the first section 715 and beyond the front side word line 720. The front side word line 720 is a shortened word line in the memory device 700.

The described back side word line 710 is an example of a back side word line formed in a single metal layer, i.e., both the first section 715 and second section 716 are in the same metal layer, e.g., the BM1 layer. FIG. 7 further shows an alternative configuration where a back side word line is formed in multiple metal layers. In the alternative configuration, a back side word line 710' comprises a first section 715' in the BM3 layer, and the second section 716 in the BM1 layer which is closer to the memory row 701 or a memory array containing the memory row 701 than the first section 715' in the BM3 layer. The first section 715' is electrically coupled to the MDLI interconnect 708 through the connection 711 and a further connection 712 comprising a BM1 conductive pattern, a BV1 via, a BM2 conductive pattern, and a BV2 via. The first section 715 is further electrically coupled to the second section 716 by a connection 713 comprising a BV1 via, a BM2 conductive pattern, and a BV2 via.

Compared to the back side word line 710, the back side word line 710' includes the first section 715' in the BM3 layer which is farther from the memory row 701 than the first section 715, and which, in one or more embodiments, has a wider metal width than the first section 715. As a result, the back side word line 710' in multiple metal layers exhibits lower resistance and capacitance than the back side word line 710 in a single metal layer, and further improves performance and/or power consumption in at least one embodiment. In at least one embodiment, one or more advantages described herein are achievable by the memory device 700 with either the back side word line 710 or the back side word line 710'.

The memory device 700 described with respect to FIG. 7 includes the back side word line 710 or back side word line 710' as a fly word line on the back side. Other configurations with a fly word line on the front side are within the scopes of various embodiments. Further, a fly word line on the front side is configurable in a single metal layer (e.g., the M1 layer) or in multiple metal layers (e.g., the M1 layer and M3 layer), in one or more embodiments. In at least one embodiment, one or more advantages described herein are achievable by a memory device comprising a fly word line on the front side.

Figures 8A, 8B:
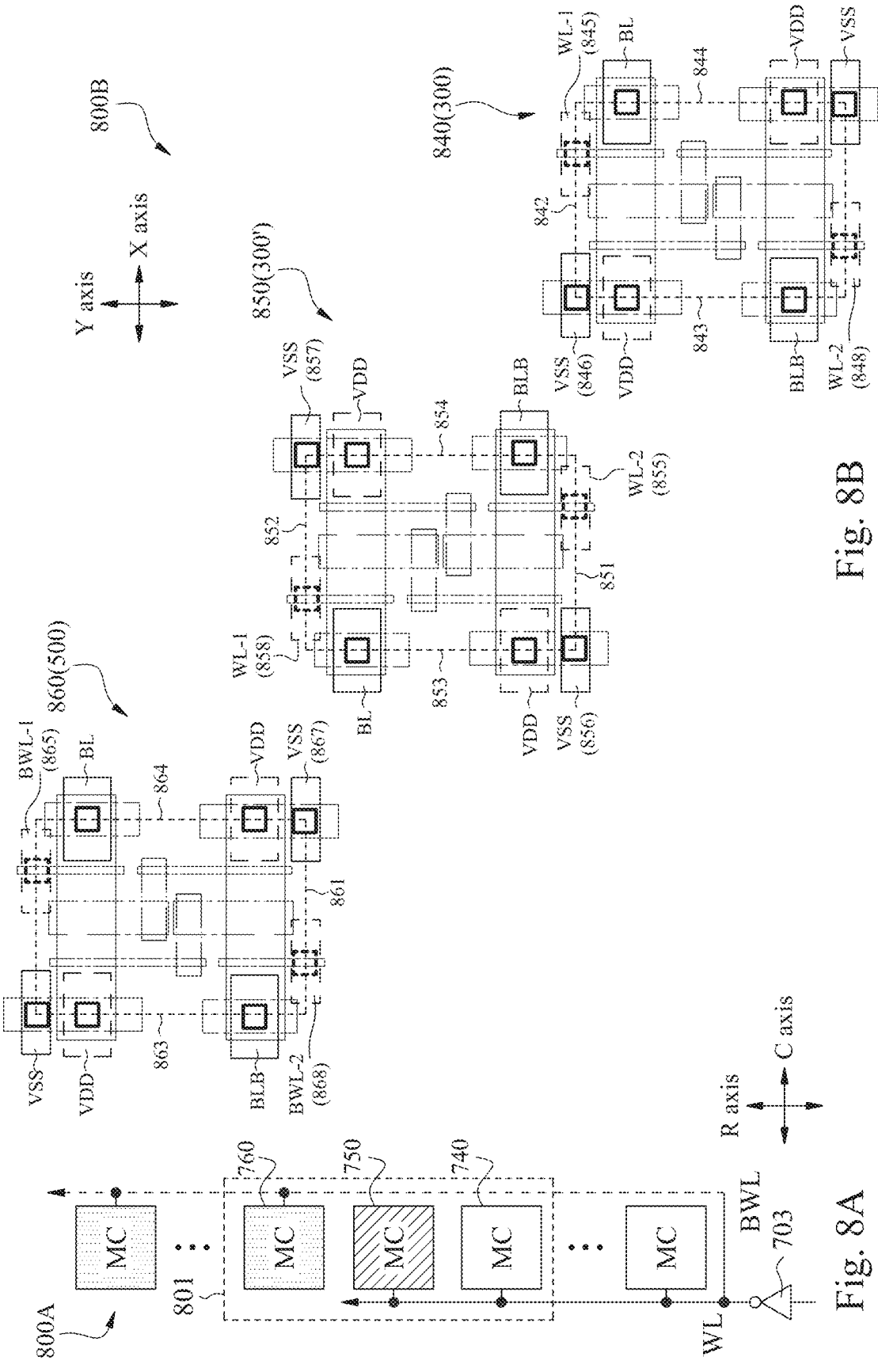
FIG. 8A is a schematic circuit diagram of a portion of a memory device.
FIG. 8B is an exploded schematic view of a corresponding portion of a layout diagram of the memory device.
Figure 8C:
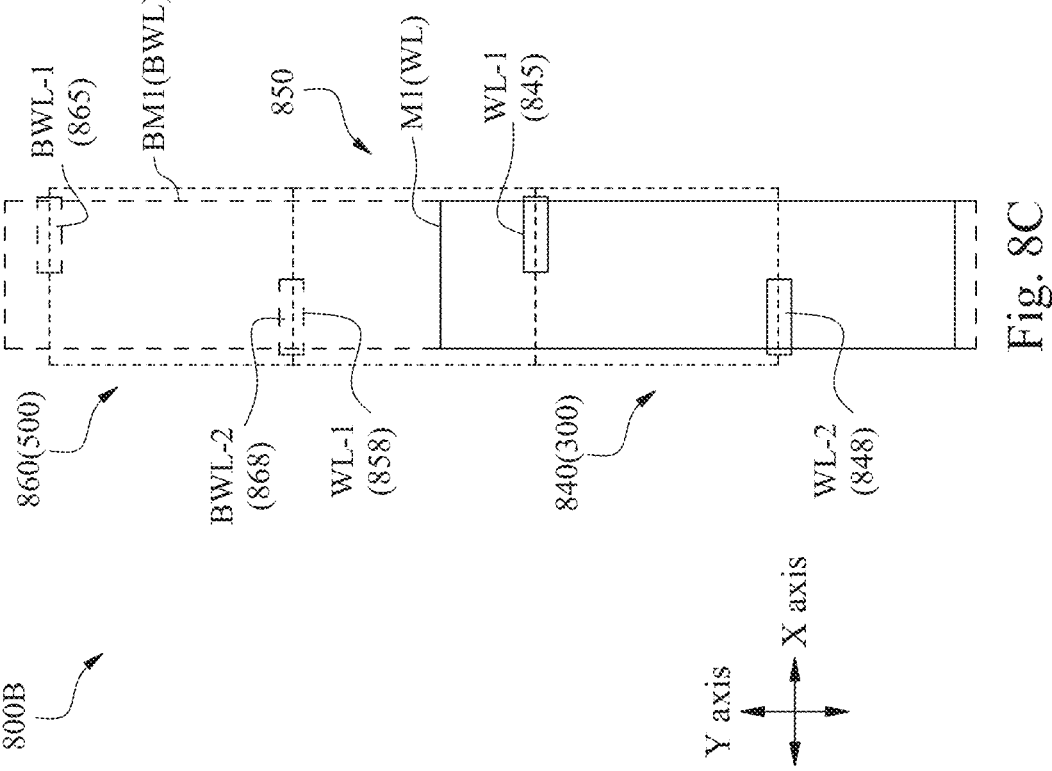
FIG. 8C is a simplified schematic view of the portion of the layout diagram of the memory device, in accordance with some embodiments.

FIG. 8A is a schematic circuit diagram of a portion of a memory device 800A, FIG. 8B is an exploded schematic view of a corresponding portion of a layout diagram 800B of the memory device 800A, and FIG. 8C is a simplified schematic view of the portion of the layout diagram 800B, in accordance with some embodiments.

In the example configuration in FIG. 8A, the memory device 800A includes components which correspond to components of the memory device 700, and are designated by the same reference numerals as the corresponding com-ponents of the memory device 700. The memory device 800A comprises a portion 801 including a memory cell 740 electrically coupled to the front side word line WL, a dummy memory cell 750, and a memory cell 760 electrically coupled to the back side word line BWL which is a fly word line. A layout diagram of the portion 801 is described with respect to FIGS. 8B, 8C.

In FIG. 8B, the layout diagram 800B of the memory device 800A includes a portion, shown in an exploded view, corresponding to the portion 801 in FIG. 8A. The layout diagram 800B comprises memory cells 840, 850, 860 corresponding to the memory cells 740, 750, 760 in FIG. 8A. The memory cell 840 has the same layout diagram as the memory cell 300. The memory cell 850 has a layout diagram of a memory cell 300' which is a version of the memory cell 300 flipped across the Y axis. The memory cell 860 has the same layout diagram as the memory cell 500. In some embodiments, the layout diagram 800B is generated by loading one or more cells from a cell library, and placing the loaded cells in abutment along the X axis and/or the Y axis. In some embodiments, the layout diagram 800B is generated as part of an automated placement and routing (APR) method. In some embodiments, one or more operations of the APR method are performed by an APR system, e.g., a system included in an EDA system described herein. In some embodiments, one or more operations of the APR method are executed by a processor, such as a processor of an EDA system described herein.

For example, in an APR operation, an edge 842 of the memory cell 840 is placed to abut an edge 851 of the memory cell 850, and an edge 852 of the memory cell 850 is placed to abut an edge 861 of the memory cell 860, while aligning edges 843, 844 of the memory cell 840 with edges 853, 854 of the memory cell 850, and with edges 863, 864 of the memory cell 860. As a result, M0 conductive patterns 845, 846 of the memory cell 840 are correspondingly merged with M0 conductive patterns 855, 856 of the memory cell 850, and an M0 conductive pattern 857 of the memory cell 850 is merged with an M0 conductive pattern 867 of the memory cell 860. An M0 conductive pattern 858 of the memory cell 850 overlaps a BM0 conductive pattern 868 of the memory cell 860.

In FIG. 8C, a simplified schematic view of the portion of the layout diagram 800B obtained after abutting the memory cells 840, 850, 860 sequentially along the Y axis is illustrated. For simplicity, the boundaries of the memory cells 840, 850, 860 and their M0 or BM0 conductive patterns for coupling to a front side word line and a back side word line are shown in FIG. 8C, whereas other components of the memory cells 840, 850, 860 are omitted.

In the layout diagram 800B, the front side word line WL extends along the Y axis over the memory cell 840, and is electrically coupled to the M0 conductive patterns 848, 845 by corresponding V0 vias (not shown). The front side word line WL does not extend over the memory cell 860. The back side word line BWL overlaps the front side word line WL along the Z axis, and extends along the Y axis under the memory cells 840, 850, 860. The back side word line BWL is not electrically coupled to the memory cell 840. The back side word line BWL is electrically coupled to the BM0 conductive patterns 865, 868 by corresponding BV0 vias (not shown). In the example configuration in FIG. 8C, the width along the X axis of the front side word line WL and back side word line BWL is close to the cell width of the memory cells 840, 850, 860 along the X axis. In at least one embodiment, one or more advantages described herein are achievable by the memory device 800A and/or an IC device corresponding to the layout diagram 800B.

Figures 9A, 9B:
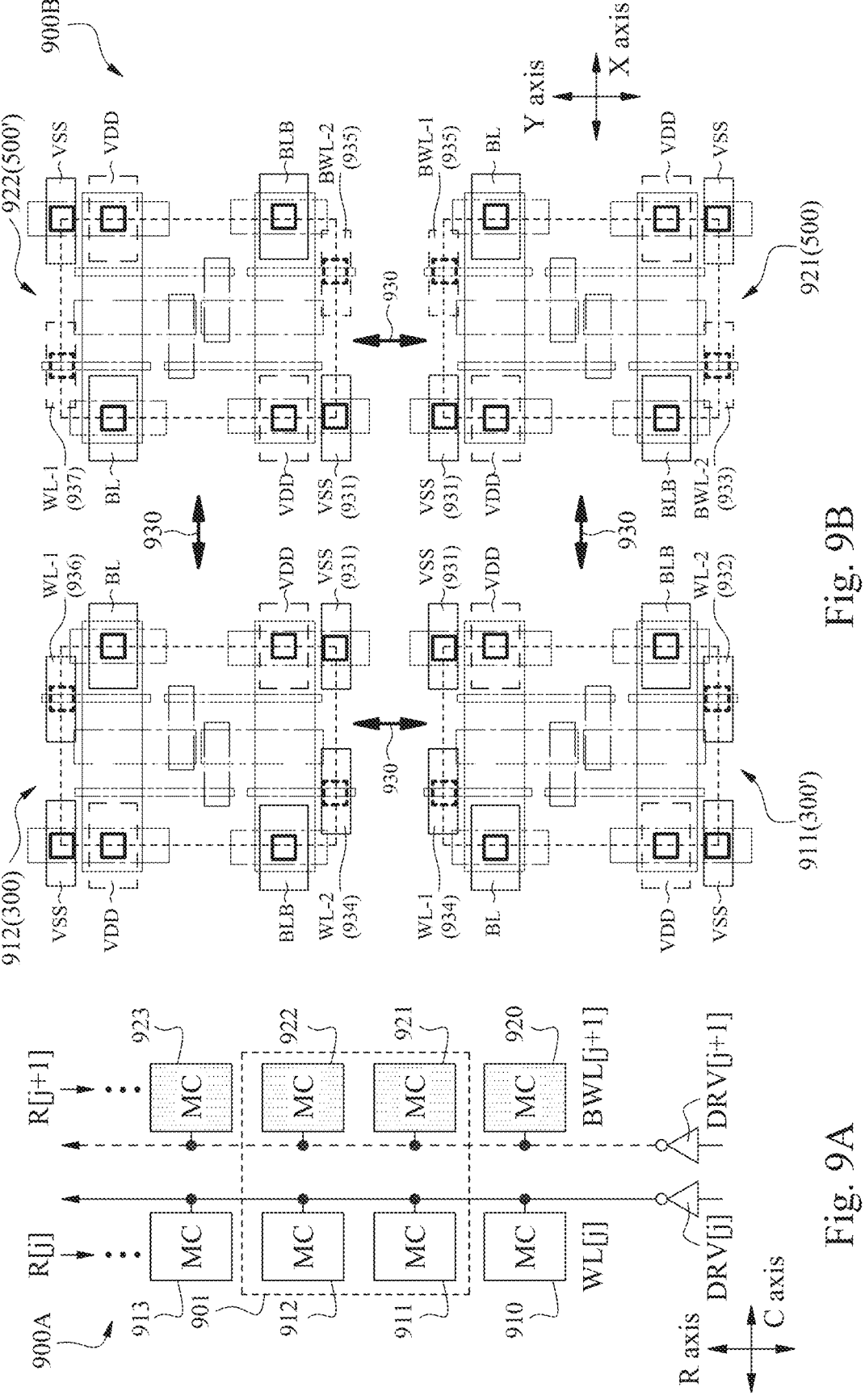
FIG. 9A is a schematic circuit diagram of a portion of a memory device.
FIG. 9B is an exploded schematic view of a corresponding portion of a layout diagram of the memory device.
Figure 9C:
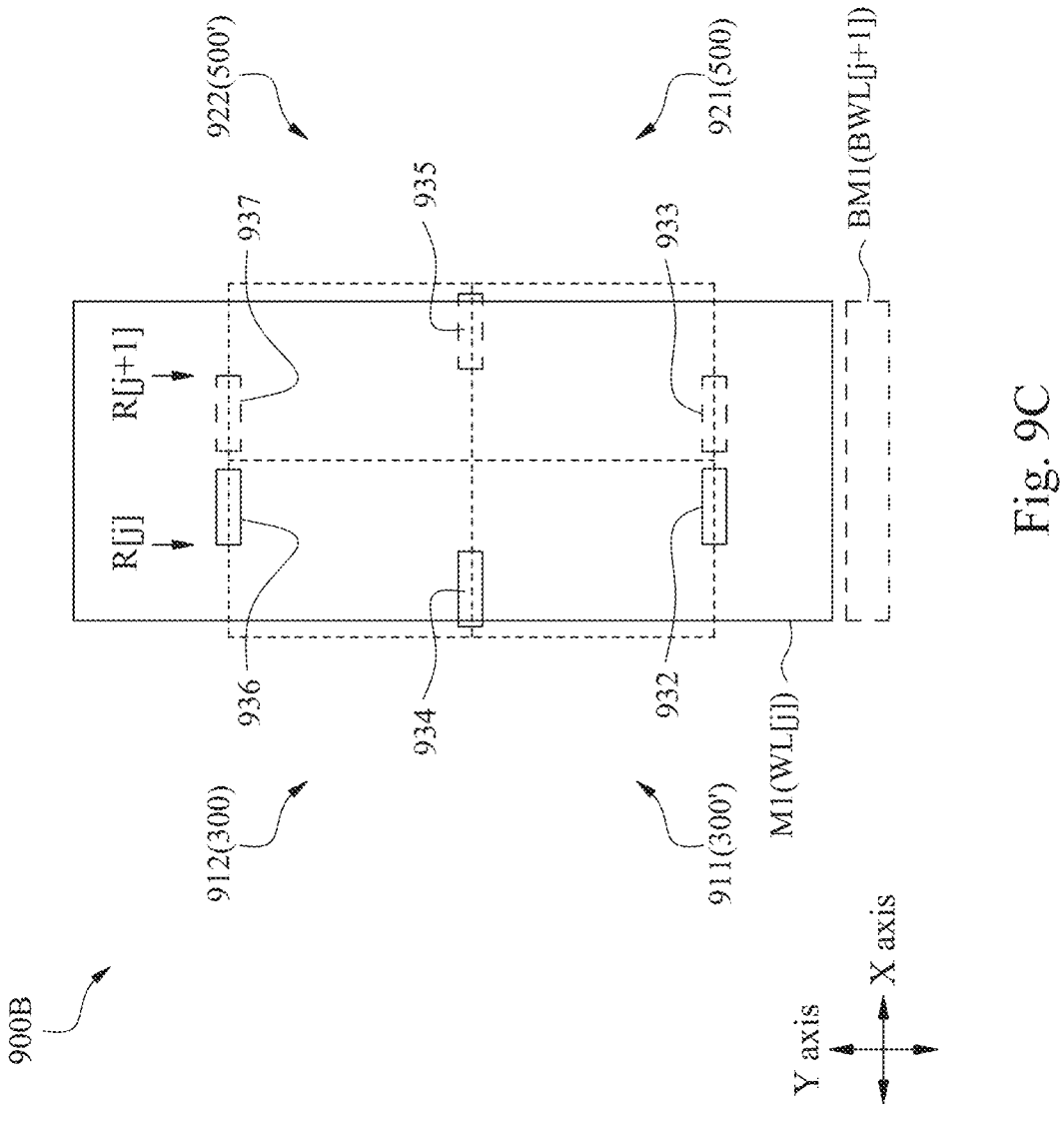
FIG. 9C is a simplified schematic view of the portion of the layout diagram of the memory device, in accordance with some embodiments.

FIG. 9A is a schematic circuit diagram of a portion of a memory device 900A, FIG. 9B is an exploded schematic view of a corresponding portion of a layout diagram 900B of the memory device 900A, and FIG. 9C is a simplified schematic view of the portion of the layout diagram 900B, in accordance with some embodiments.

Although not illustrated in FIG. 9A, the memory device 900A comprises a memory array, a plurality of word lines, a plurality of bit lines, and a controller comprising word line drivers, as described with respect to FIGS. 1A-IC. In the portion illustrated in FIG. 9A, the memory device 900A includes memory rows R[j], R[j+1] of the memory array, a front side word line WL[j] and a back side word line BWL[j+1] among the plurality of word lines, and word line drivers DRV[j], DRV[j+1] among the word line drivers of the memory controller, where j is a natural number smaller than m. The front side word line WL[j] is electrically coupled to an output of the word line driver DRV[j], and the back side word line BWL[j+1] is electrically coupled to an output of the word line driver DRV[j+1]. As a result, the front side word line WL[j] and back side word line BWL [j+1] are independently controlled by the corresponding word line drivers DRV[j], DRV[j+1]. One of the front side word line WL[j] and back side word line BWL[j+1] is an even word line, and the other of the front side word line WL[j] and back side word line BWL[j+1] is an odd word line. In some embodiments, the portion of the memory device 900A illustrated in FIG. 9A is repeated along the column direction (i.e., the C axis), resulting in a hybrid word line configuration with even front side word lines and odd back side word lines, or with odd front side word lines and even back side word lines.

Each memory cell MC in the memory row R[j] and a corresponding, or adjacent, memory cell MC in the memory row R[j+1] are arranged in a same memory column among a plurality of memory columns in the memory array of the memory device 900A. For example, the memory row R[j] comprises memory cells 910-913, and the memory row R[j+1] comprises memory cells 920-923. The adjacent or corresponding memory cells 910, 920 belong to a first memory column, and are coupled to a same bit line BL (not shown) or a same pair of bit lines BL, BLB (not shown). Similarly, the corresponding memory cells 911, 921 belong to a second memory column, the corresponding memory cells 912, 922 belong to a third memory column, or the like.

Each memory cell MC in the memory row R[j] is electrically coupled to one of the front side word line WL[j] and back side word line BWL[j+1], whereas the corresponding memory cell MC in the memory row R[j+1] is electrically coupled to the other of the front side word line WL[j] and back side word line BWL[j+1]. In the example configuration in FIG. 9A, all memory cells 910-913, or the like, in the memory row R[j] are coupled to the front side word line WL[j], and all corresponding memory cells 920-923, or the like, in the memory row R[j+1] are coupled to the back side word line BWL[j+1].

In some embodiments, it is possible that at least one memory cell in a memory row is coupled to a front side word line, whereas at least one further memory cell in the same memory row is coupled to a back side word line. For example, in at least one example embodiment, the memory cell 910 in the memory row R[j] is electrically coupled to the back side word line BWL[j+1] while the other memory cells 911-913 in the memory row R[j] are electrically coupled to the front side word line WL[j]. In such example embodiment, the corresponding memory cell 920 in the memory row R[j+1] is electrically coupled to the front side word line WL[j] while the other corresponding memory cells 921-923 in the memory row R[j+1] are electrically coupled to the back side word line BWL[j+1]. In some embodiments, there is no limit or constraint on which memory cell in a memory row is to be coupled to a front side word line and which further memory cell in the same memory row is to be coupled to a back side word line. For example, any memory cell in the memory row R[j] is electrically couplable to any one of the front side word line WL[j] and back side word line BWL[j+1], provided that the corresponding memory cell in the memory row R[j+1] is electrically coupled to the other of the front side word line WL[j] and back side word line BWL[j+1]. Any arrangement (or dichotomy), along a memory row, of memory cells electrically coupled to a front side word line and memory cells electrically coupled to a back side word line is possible in one or more embodiments. Further example embodiments where memory cells in a memory row are coupled to a front side word line and a back side word line are described with respect to FIGS. 9D-9F. A layout diagram of a portion 901 including memory cells 911, 912, 921, 922 in FIG. 9A is described with respect to FIGS. 9B, 9C.

In FIG. 9B, the layout diagram 900B of the memory device 900A includes a portion, shown in an exploded view, corresponding to the portion 901 in FIG. 9A. In the layout diagram 900B, the memory cell 911 has the same layout diagram as the memory cell 300', the memory cell 912 has the same layout diagram as the memory cell 300, the memory cell 921 has the same layout diagram as the memory cell 500, and the memory cell 922 has a layout diagram of a memory cell 500' which is a version of the memory cell 500 flipped across the Y axis. In some embodiments, the layout diagram 900B is generated by an APR operation as described herein. For example, in an APR operation, facing edges of the memory cells 911, 912, 921, 922 are placed in abutment, as schematically indicated by double-end arrows 930. As a result, M0 conductive patterns 931 of the memory cells 911, 912, 921, 922 are merged into a common M0 conductive pattern for VSS, M0 conductive patterns 934 of the memory cells 911, 912 are merged into a common M0 conductive pattern for a front side word line, and BM0 conductive patterns 935 of the memory cells 921, 922 are merged into a common BM0 conductive pattern for a back side word line.

In FIG. 9C, a simplified schematic view of the portion of the layout diagram 900B obtained after abutting the memory cells 911, 912, 921, 922 is illustrated. For simplicity, the boundaries of the memory cells 911, 912, 921, 922 and their M0 or BM0 conductive patterns for coupling to a front side word line and a back side word line are shown in FIG. 9C, whereas other components of the memory cells 911, 912, 921, 922 are omitted.

In the layout diagram 900B, the front side word line WL[j] extends along the Y axis over the length of the memory rows R[j], R[j+1], and overlaps the memory cells of both the memory rows R[j], R[j+1]. Likewise, the back side word line BWL[j+1] extends along the Y axis over the length of the memory rows R[j], R[j+1], and overlaps the memory cells of both the memory rows R[j], R[j+1]. For simplicity, the back side word line BWL[j+1] is schematically indicated in FIG. 9C, without being fully illustrated. The front side word line WL[j] is electrically coupled to the underlying memory cells by V0 vias (not shown) and corresponding M0 conductive patterns 932, 934, 936. The back side word line BWL[j+1] is electrically coupled to the overlying memory cells by BV0 vias (not shown) and corresponding BM0 conductive patterns 933, 935, 937.

The back side word line BWL[j+1] overlaps the front side word line WL[j] over the length of the memory rows R[j], R[j+1] along the Y axis, and has about a same width as the front side word line WL[j] along the X axis. In the example configuration in FIG. 9C, the width along the X axis of the front side word line WL[j] and back side word line BWL [j+1] is greater than the cell width of each memory cell 911, 912, 921, 922 along the X axis, and is close to twice the cell width. In some embodiments, the front side word line WL[j] and back side word line BWL[j+1] have a width which is about two times wider than the width of the front side word line and back side word line described with respect to FIG. 8C. With such a wider width, it is possible in one or more embodiments to reduce the resistance of both the front side word line WL[j] and back side word line BWL[j+1], reduce word line loading, and improve performance and/or power consumption, without an area penalty associated with, for example, dummy memory cells. In at least one embodiment, one or more advantages described herein are achievable by the memory device 900A and/or an IC device corresponding to the layout diagram 900B.

Figures 9D, 9E, 9F:
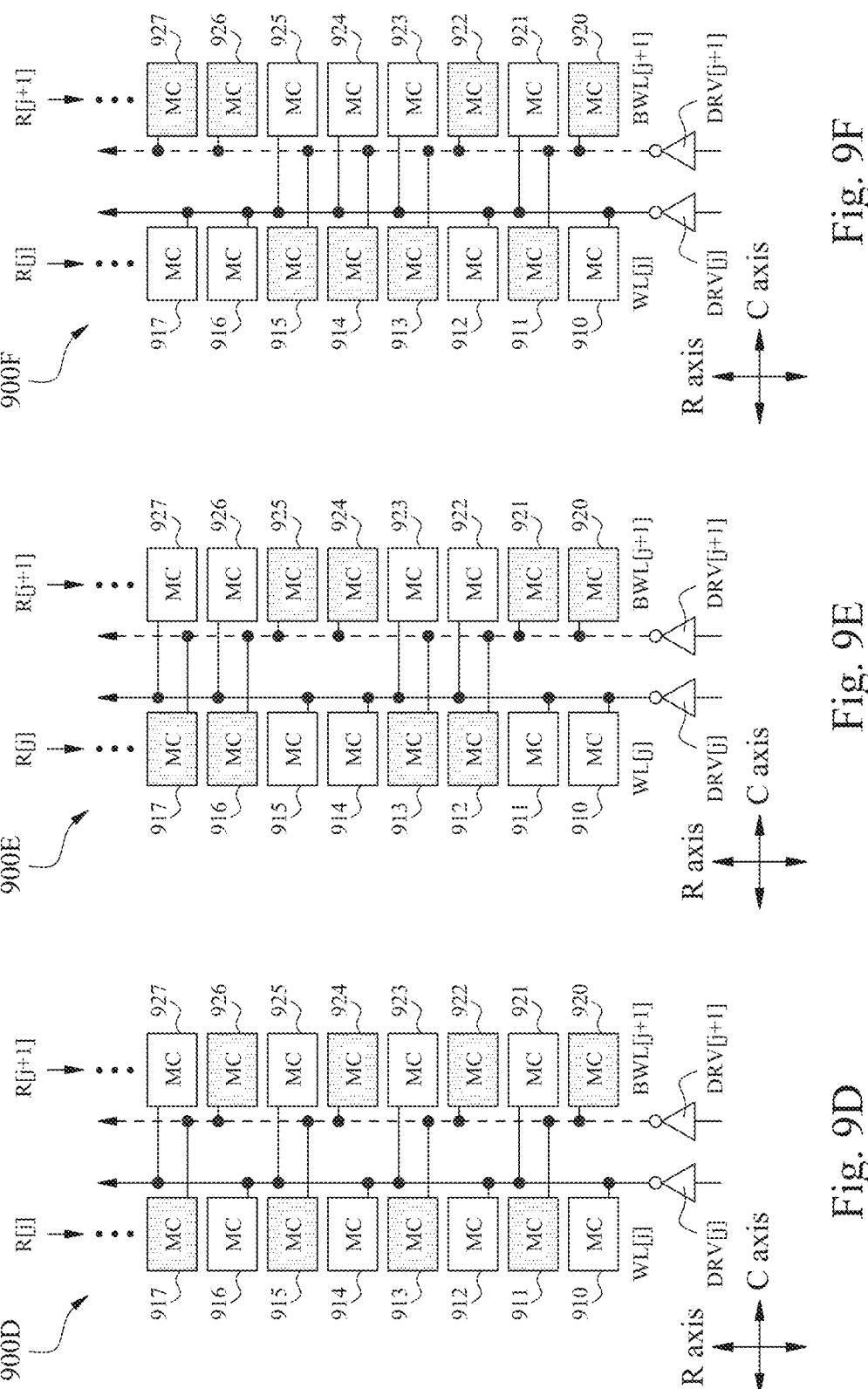
FIGS. 9D-9F are schematic circuit diagrams of portions of various memory devices, in accordance with some embodiments.

FIGS. 9D-9F are schematic circuit diagrams of various portions of memory devices 900D-900F, in accordance with some embodiments. In some embodiments, one or more of the memory devices 900D-900F correspond to one or more of the memory devices 100A-100C and 900A. For simplicity, corresponding components in FIGS. 9A and 9D-9F are designated by the same reference numerals.

In FIGS. 9D-9E, the memory cells 910-917, or the like, of the memory row R[j] comprises a plurality of first memory cells electrically coupled to the front side word line WL[j], and a plurality of second memory cells electrically coupled to the back side word line BWL[j+1]. The memory cells 920-927, or the like, of the memory row R[j+1] comprises a plurality of third memory cells corresponding to the first memory cells in the memory row R[j] and electrically coupled to the back side word line BWL[j+1], and a plurality of fourth memory cells corresponding to the second memory cells in the memory row R[j] and electrically coupled to the front side word line WL[j].

For example, in the memory device 900D in FIG. 9D, the memory row R[j] comprises first memory cells 910, 912, 914, 916, or the like, electrically coupled to the front side word line WL[j], and second memory cells 911, 913, 915, 917, or the like, electrically coupled to the back side word line BWL[j+1]. The memory row R[j+1] comprises third memory cells 920, 922, 924, 926, or the like, electrically coupled to the back side word line BWL[j+1], and fourth memory cells 921, 923, 925, 927, or the like, electrically coupled to the front side word line WL[j]. The first memory cells 910, 912, 914, 916, or the like, are arranged in a plurality of first memory cell groups each having one first memory cell, whereas the second memory cells 911, 913, 915, 917, or the like, are arranged in a plurality of second memory cell groups each having one second memory cell. The first memory cell groups and the second memory cell groups are arranged alternatingly along the memory row R[j]. As a result, the first memory cells 910, 912, 914, 916, or the like, are arranged alternatingly with the second memory cells 911, 913, 915, 917, or the like along the memory row R[j]. The third memory cells 920, 922, 924, 926, or the like, and fourth memory cells 921, 923, 925, 927, or the like, in the memory row R[j+1] are grouped and/or arranged in a similar manner. In some embodiments, a layout diagram of the memory device 900D is similar to the layout diagram 900B, except that along each of the memory rows R[j], R[j+1], M0 conductive patterns for the front side word line WL[j] are arranged alternatingly with BM0 conductive patterns for the back side word line BWL[j+1].

For a further example, in the memory device 900E in FIG. 9E, the memory row R[j] comprises first memory cells 910, 911, 914, 915, or the like, electrically coupled to the front side word line WL[j], and second memory cells 912, 913, 916, 917, or the like, electrically coupled to the back side word line BWL[j+1]. The memory row R[j+1] comprises third memory cells 920, 921, 924, 925, or the like, electrically coupled to the back side word line BWL[j+1], and fourth memory cells 922, 923, 926, 927, or the like, electrically coupled to the front side word line WL[j]. The first memory cells 910, 911, 914, 915, or the like, are arranged in a plurality of first memory cell groups each having two first memory cells, e.g., a memory cell group of memory cells 910, 911, and a further memory cell group of memory cells 914, 915, or the like. The second memory cells 912, 913, 916, 917, or the like, are arranged in a plurality of second memory cell groups each having two second memory cells, e.g., a memory cell group of memory cells 912, 913, and a further memory cell group of memory cells 916, 917, or the like. The first memory cell groups and the second memory cell groups are arranged alternatingly along the memory row R[j]. The third memory cells 920, 921, 924, 925, or the like, and fourth memory cells 922, 923, 926, 927, or the like, in the memory row R[j+1] are grouped and/or arranged in a similar manner.

The memory devices 900D, 900E are examples where the first memory cell groups and the second memory cell groups have the same number of memory cells, i.e., the first memory cells electrically coupled to the front side word line WL[j] and the second memory cells electrically coupled to the back side word line BWL[j+1] are arranged at a regular interval and/or in a repeated pattern along the memory row R[j]. However, as described herein, any arrangement (or dichotomy) of memory cells electrically coupled to a front side word line and memory cells electrically coupled to a back side word line is possible in one or more embodiments. For example, in some embodiments, a first memory cell group includes a number of memory cells different from another first memory cell group, and/or different from a second memory cell group.

In FIG. 9F, the memory device 900F is an example where first memory cells 910, 912, 916, 917, or the like, electrically coupled to the front side word line WL[j], and second memory cells 911, 913, 914, 915, or the like, electrically coupled to the back side word line BWL[j+1] are arranged along the memory row R[j] in a random manner without a repeated pattern. In at least one embodiment, one or more advantages described herein are achievable by one or more of the memory devices 900D-900F.

Figure 10A:
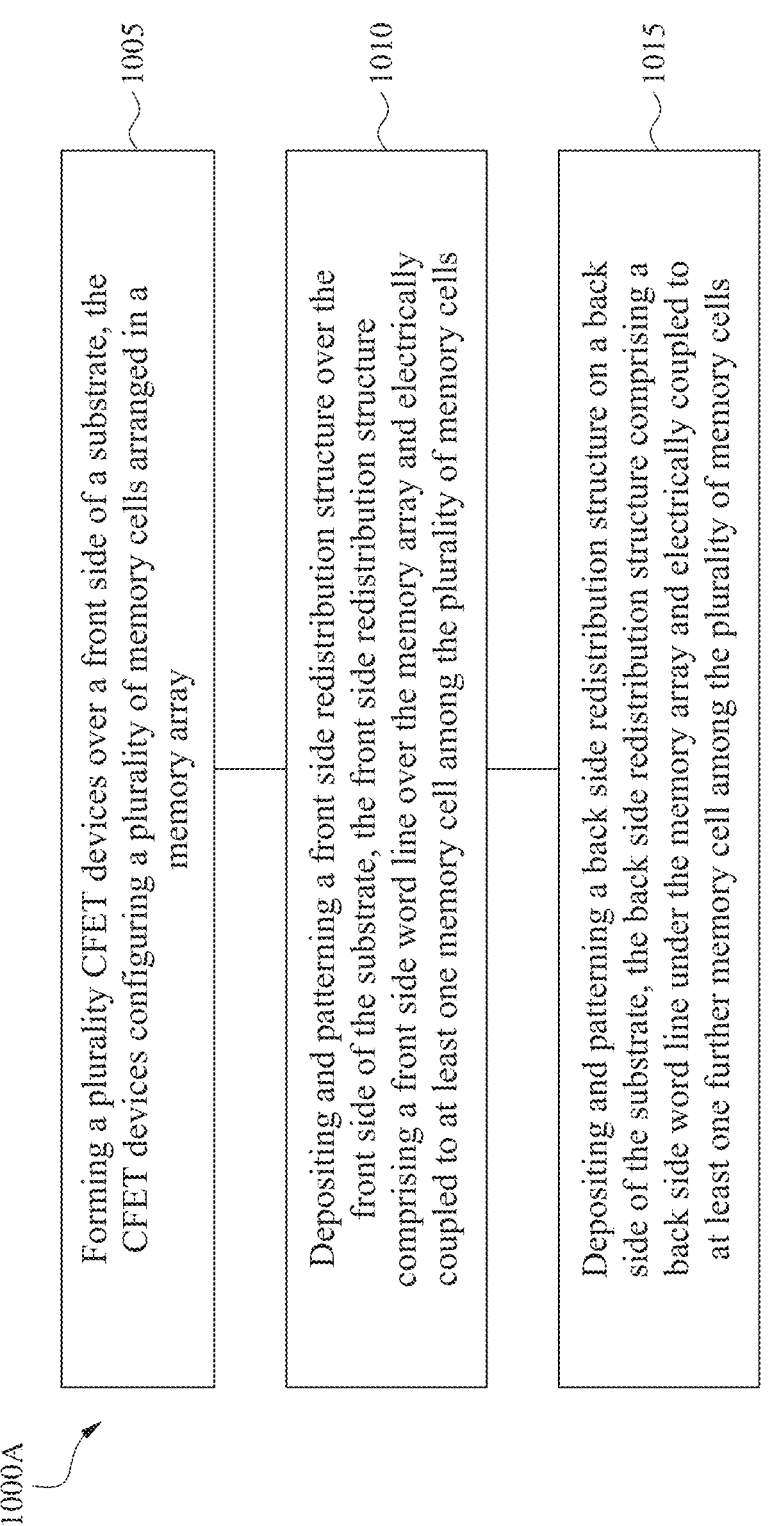

FIG. 10A is a flowchart of a method 1000A of manufacturing an IC device, in accordance with some embodiments. In some embodiments, the method 1000A is usable to manufacture one or more memory devices as described herein.

At operation 1005, a plurality CFET devices is formed over a front side of a substrate, the CFET devices configuring a plurality of memory cells arranged in a memory array. For example, various CFET devices are formed over a front side 441 of a substrate 440 to configure memory cells as described with respect to FIGS. 4A-4D.

Referring to FIGS. 4A-4D, an example manufacturing process starts from the substrate 440. In some embodiments, the substrate 440 is a silicon-on-insulator (SOI) substrate having a semiconductor bulk, and an insulation layer over the semiconductor bulk. Other substrate configurations are within the scopes of various embodiments.

Alternating layers of a first semiconductor material and a second semiconductor material different from the first semiconductor material are sequentially deposited over the front side 441 of the substrate 440. In some embodiments, the first semiconductor material comprises silicon, and the second semiconductor material comprises SiGe. As a result, alternating SiGe/Si/SiGe/Si layers are stacked over the front side 441 of the substrate 440. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, dummy gate structures (not shown) are formed over the alternating layers SiGe/Si/SiGe/Si, to be used as a mask for subsequent patterning, and for later formation of a metal gate. In an example, each dummy gate structure includes various dummy layers, such as a dummy gate electrode (e.g., polysilicon), a hard mask layer (e.g., SiN, SiCN, SiO, or the like). The dummy gate structures are formed by deposition processes, lithography processes, etching processes, combinations thereof, or the like. The alternating layers SiGe/Si/SiGe/Si are patterned by using the dummy gate structures as a mask.

Various semiconductor devices are next fabricated. In at least one embodiment, isolation regions are formed in trenches to separate and electrically isolate active regions of the devices to be manufactured. In some embodiments, one or more dielectric materials, such as SiO and/or SiN, are deposited, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the isolation regions.

In some embodiments, SiGe at exposed edges of the alternating layers SiGe/Si/SiGe/Si are selectively removed by an etching process. In some embodiments, the selective removal of SiGe include an oxidation process followed by a selective etching.

In some embodiments, source/drains features similar to the source/drains 464, 465 are epitaxially grown as epitaxy structures. The source/drain features are grown to be in contact with the exposed edges of the Si layers. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the dummy gate structures with metal gate structures. In some embodiments, the dummy gate structures are removed by one or more etching processes, such as wet etching, dry etching, or the like. The SiGe layers are selectively removed by a selective oxidation/etching process. The Si layers remain, and configure nanosheets 461, 462 for top and bottom semiconductor devices. Metal gate structures are formed to wrap around the nanosheets 461, 462. In some embodiments, each metal gate structure includes a gate dielectric wrapping around the nanosheets 461, 462, and a metal gate, e.g., gate G1, over the gate dielectric to obtain corresponding top and bottom semiconductor devices, e.g., transistors N1, P1. Example materials of the gate dielectric includes a high-k dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZiO, BaTiO3 (BTO), (Ba,Sr)TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate includes one or more metals such as Al, Cu, W, Ti, Ta, TiN, TaN, NiSi, CoSi, and is formed by, e.g., CVD, ALD, PVD, plating, chemical oxidation, thermal oxidation, or the like.

One or more interconnects MDLI, MD contact structures, VD vias, VG vias are formed, e.g., by etching and metal depositing operations.

At operation 1010, deposition and patterning operations are performed to form a front side redistribution structure over the front side of the substrate. The front side redistribution structure comprises a front side word line over the memory array and electrically coupled to at least one memory cell among the plurality of memory cells. For example, a front side redistribution structure 466 is formed over the front side 441 of the substrate 440. The front side redistribution structure 466 comprises a front side word line WL, e.g., in the M1 layer, over the memory array and electrically coupled to at least one memory cell among the plurality of memory cells, as described herein, e.g., with respect to one or more of FIGS. 1A-1C, 7.

At operation 1015, deposition and patterning operations are performed to form a back side redistribution structure on the back side of the substrate. The back side redistribution structure comprises a back side word line under the memory array and electrically coupled to at least one further memory cell among the plurality of memory cells. For example, after forming the front side redistribution structure 466, the IC device being manufactured is flipped upside down and temporarily bonded to a carrier. Wafer thinning is performed from the back side 442 (now facing upward) to remove a portion of the substrate 440. In some embodiments, the wafer thinning process includes a grinding operation, a polishing operation (such as, chemical mechanical polishing (CMP)), or the like. In at least one embodiment, an original substrate for forming the CFET devices is completely removed, and a new substrate, e.g., an insulation substrate, is formed over the CFET devices. A back side redistribution structure 467 is formed over the back side 442 of the substrate 440 by deposition and patterning operations. The back side redistribution structure 467 comprises a back side word line BWL, e.g., in the BM1 layer, under the memory array and electrically coupled to at least one further memory cell among the plurality of memory cells, as described herein, e.g., with respect to one or more of FIGS. 1A-1C, 7.

In some embodiments, one or more advantages described herein are achievable by one or more IC devices manufactured by the method 1000A. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

FIG. 10B is a flowchart of a method 1000B of operating a memory device, in accordance with some embodiments. In some embodiments, the method 1000B is usable to operate one or more memory devices as described herein, e.g., with respect to one or more of FIGS. 1A-IC, 2, 7.

At operation 1030, an access voltage is applied to memory cells in a row through a first word line over the row and a second word line under the row. The first word line is electrically coupled to first memory cells among the memory cells in the row, and the second word line is electrically coupled to second memory cells among the memory cells in the row. For example, as described with respect to FIG. 1A, the controller 102 controls the word line driving circuit 103 to apply, e.g., by the word line driver 130, an access voltage WL(0) to memory cells MC in the memory row R[0], through a front side word line WL[0] over the memory array 101, and a back side word line BWL[0] under the memory array 101. The front side word line WL[0] is electrically coupled to first memory cells of the first bank 111 in the memory row R[0], and the back side word line BWL[0] is electrically coupled to second memory cells of the second bank 112 in the memory row R[0].

At operation 1035, data are read from the first memory cells and the second memory cells, while a datum read from a dummy memory cell in the row and between the first memory cells and the second memory cells is ignored. For example, as described with respect to FIG. 1A, the controller 102 controls the bit line multiplexers 104 and/or read/write circuits 105 to read data from the first memory cells of the first bank 111 and from the second memory cells of the second bank 112, through the corresponding bit lines BL. In such a reading operation, a datum read from a dummy memory cell DMC in the memory row R[0] and between the first memory cells of the first bank 111 and the second memory cells of the second bank 112 is ignored, as described with respect to FIG. 1A. In some embodiments, by accessing memory cells in the memory array 101 using both front side word lines and back side word lines, it is possible to improve performance and/or power consumption, as described herein.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 11:
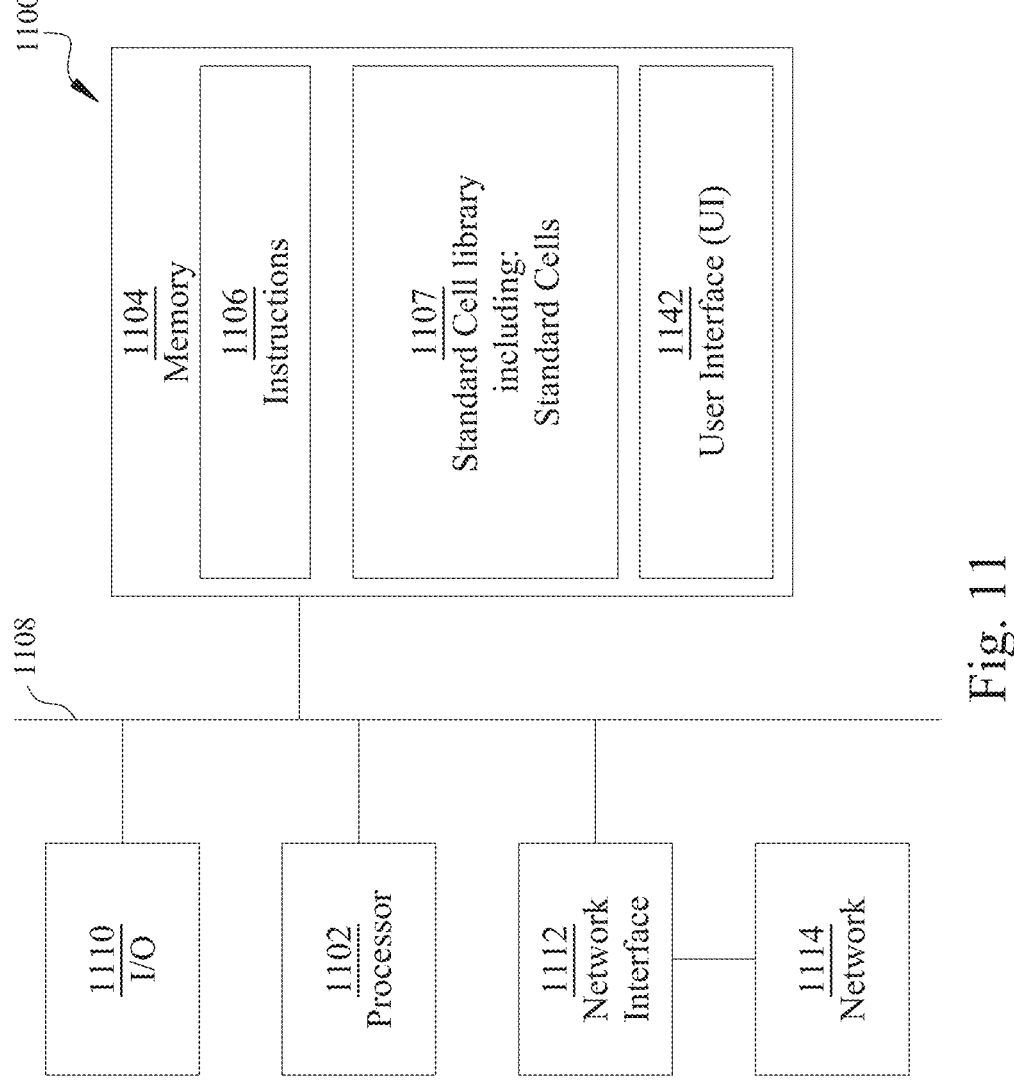
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
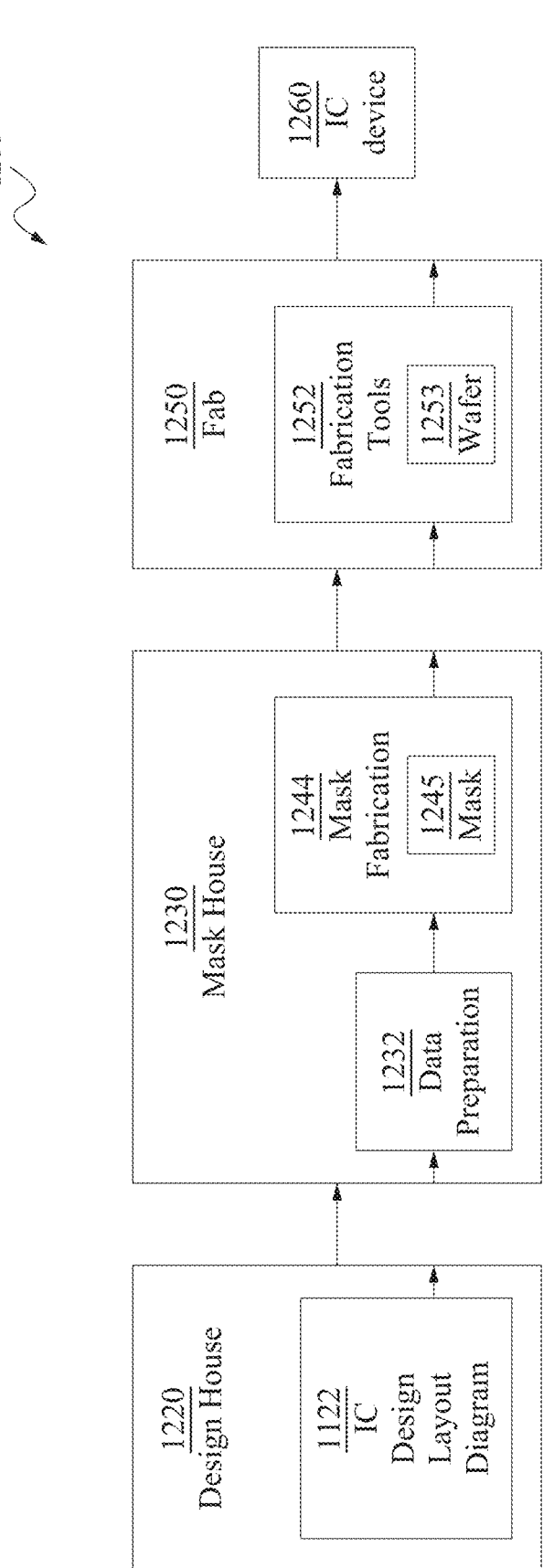
FIG. 12 is a block diagram of an IC device manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place-and-route operation. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP)

to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

In some embodiments, an integrated circuit (IC) device comprises a memory array comprising a plurality of memory cells, a first word line over the memory array and electrically coupled to at least one first memory cell among the plurality of memory cells, and a second word line under the memory array and electrically coupled to at least one second memory cell among the plurality of memory cells. Each memory cell among the plurality of memory cells comprises complementary field-effect transistor (CFET) devices.

In some embodiments, an integrated circuit (IC) device comprises a memory array comprising a plurality of memory cells arranged in a plurality of columns and a plurality of rows of the memory array, a first word line over the memory array, and a second word line under the memory array. The plurality of rows comprises a first row and a second row. Each memory cell in the first row and a corresponding memory cell in the second row are arranged in a same column among the plurality of columns of the memory array. Each memory cell in the first row is electrically coupled to one of the first word line and the second word line, and the corresponding memory cell in the second row is electrically coupled to the other of the first word line and the second word line.

In a method in accordance with some embodiments, a plurality of memory cells is formed over a front side of a substrate. The plurality of memory cells is arranged in a memory array. A front side redistribution structure is deposited and patterned over the front side of the substrate. The front side redistribution structure comprises a front side word line over the memory array and electrically coupled to at least one first memory cell among the plurality of memory cells. A back side redistribution structure is deposited and patterned on a back side of the substrate. The back side redistribution structure comprises a back side word line under the memory array and electrically coupled to at least one second memory cell among the plurality of memory cells. The front side word line has a section extending over the at least one second memory cell without being electrically coupled to the at least one second memory cell, or the back side word line has a section extending under the at least one first memory cell without being electrically coupled to the at least one first memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:

a memory array comprising a plurality of memory cells;

a first word line over the memory array, and electrically coupled to at least one first memory cell among the plurality of memory cells; and a second word line under the memory array, and electrically coupled to at least one second memory cell among the plurality of memory cells, wherein each memory cell among the plurality of memory cells comprises complementary field-effect transistor (CFET) devices.

2. The IC device of claim 1, wherein each memory cell among the plurality of memory cells comprises a static random-access memory (SRAM) cell.

3. The IC device of claim 1, further comprising:

a word line driver having an output electrically coupled to both the first word line and the second word line.

4. The IC device of claim 1, wherein the first word line is electrically coupled to the second word line.

5. The IC device of claim 4, wherein the first word line has a section extending over the at least one second memory cell, without being electrically coupled to the at least one second memory cell, or the second word line has a section extending under the at least one first memory cell, without being electrically coupled to the at least one first memory cell.

6. The IC device of claim 4, wherein the first word line comprises:

a first section extending in parallel with the second word line, and over the at least one second memory cell without being electrically coupled to the at least one second memory cell, and a second section extending from the first section further beyond the second word line, and electrically coupled to the at least one first memory cell, or the second word line comprises:

a first section extending in parallel with the first word line, and under the at least one first memory cell without being electrically coupled to the at least one first memory cell, and a second section extending from the first section further beyond the first word line, and electrically coupled to the at least one second memory cell.

7. The IC device of claim 6, wherein the first section of the first word line is in a first metal layer, and the second section of the first word line is in a second metal layer closer to the memory array than the first metal layer, or the first section of the second word line is in a first metal layer, and the second section of the second word line is in a second metal layer closer to the memory array than the first metal layer.

8. The IC device of claim 6, wherein both the first section and the second section of the first word line are in a same metal layer, or both the first section and the second section of the second word line are in a same metal layer.

9. The IC device of claim 6, wherein the at least one first memory cell and the at least one second memory cell are arranged in a same row of memory cells in the memory array, and the row further comprises a dummy memory cell between the at least one first memory cell and the at least one second memory cell.

10. The IC device of claim 1, wherein the memory array comprises a plurality of rows and a plurality of columns in which the plurality of memory cells is arranged, the plurality of rows comprises a first row and a second row, each of the first word line and the second word line overlaps the memory cells in both the first row and the second row, the at least one first memory cell comprises a plurality of first memory cells, the at least one second memory cell comprises a plurality of second memory cells, and each first memory cell among the plurality of first memory cells and a corresponding second memory cell among the plurality of second memory cells are arranged in a same column among the plurality of columns of the memory array.

11. An integrated circuit (IC) device, comprising:

a memory array comprising a plurality of memory cells arranged in a plurality of columns and a plurality of rows of the memory array, wherein the plurality of rows comprises a first row and a second row, a first word line over the memory array; and a second word line under the memory array, wherein each memory cell in the first row and a corresponding memory cell in the second row are arranged in a same column among the plurality of columns of the memory array, and each memory cell in the first row is electrically coupled to one of the first word line and the second word line, and the corresponding memory cell in the second row is electrically coupled to the other of the first word line and the second word line.

12. The IC device of claim 11, wherein each memory cell among the plurality of memory cells comprises complementary field-effect transistor (CFET) devices.

13. The IC device of claim 12, wherein each memory cell among the plurality of memory cells comprises a static random-access memory (SRAM) cell.

14. The IC device of claim 11, wherein all memory cells in the first row are electrically coupled to the first word line, and all memory cells in the second row are electrically coupled to the second word line.

15. The IC device of claim 11, wherein the first row comprises:

first memory cells electrically coupled to the first word line, and second memory cells electrically coupled to the second word line, and the second row comprises:

third memory cells corresponding to the first memory cells, and electrically coupled to the second word line, and fourth memory cells corresponding to the second memory cells, and electrically coupled to the first word line.

16. The IC device of claim 15, wherein the first memory cells are arranged in a plurality of first memory cell groups, the second memory cells are arranged in a plurality of second memory cell groups, and the plurality of first memory cell groups and the plurality of second memory cell groups are arranged alternatingly along the first row.

17. The IC device of claim 16, wherein each of the plurality of first memory cell groups comprises a same number of first memory cells, and each of the plurality of second memory cell groups comprises the same number of second memory cells.

18. The IC device of claim 16, wherein at least one of the plurality of first memory cell groups comprises a number of first memory cells different from at least another one of the plurality of first memory cell groups.

19. A method, comprising:

forming a plurality of memory cells over a front side of a substrate, the plurality of memory cells arranged in a memory array;

depositing and patterning a front side redistribution structure over the front side of the substrate, the front side redistribution structure comprising a front side word line over the memory array and electrically coupled to at least one first memory cell among the plurality of memory cells;

depositing and patterning a back side redistribution structure on a back side of the substrate, the back side redistribution structure comprising a back side word line under the memory array and electrically coupled to at least one second memory cell among the plurality of memory cells, wherein the front side word line has a section extending over the at least one second memory cell, without being electrically coupled to the at least one second memory cell, or the back side word line has a section extending under the at least one first memory cell, without being electrically coupled to the at least one first memory cell.

20. The method of claim 19, further comprising:

electrically coupling the front side word line to the back side word line.

\* \* \* \* \*